US012724138B2

(12) United States Patent
Cui et al.

(10) Patent No.: US 12,724,138 B2
(45) Date of Patent: Sep. 1, 2026

(54) ELECTRONIC DEVICES WITH MOTION-BASED RADIO-FREQUENCY ENVIRONMENT MAPPING

(71) Applicant: Apple Inc., Cupertino, CA (US)

(72) Inventors: Jiaming Cui, Milpitas, CA (US); Jonathan Ah Sue, Munich (DE); Nayef A Alsindi, Dublin, CA (US); Andreas Menkhoff, Oberhaching (DE); Matthew A Mow, Los Altos, CA (US); Tideya Kella, San Jose, CA (US); Joseph Hakim, Jacksonville, OR (US)

(73) Assignee: Apple Inc., Cupertino, CA (US)

( * ) Notice: Subject to any disclaimer, the term of this patent is extended or adjusted under 35 U.S.C. 154(b) by 269 days.

(21) Appl. No.: 18/582,625

(22) Filed: Feb. 20, 2024

(65) Prior Publication Data

US 2025/0264598 A1 Aug. 21, 2025

(51) Int. Cl.
*G01S 13/56* (2006.01)
*H03M 1/12* (2006.01)

(52) U.S. Cl.
CPC ............... *G01S 13/56* (2013.01); *H03M 1/12* (2013.01)

(58) Field of Classification Search
CPC .......... G01S 13/56; G01S 13/52; G01S 7/021; G01S 7/022; G01S 7/032; G01S 13/003; G01S 13/42; H03M 1/12
USPC ......................................... 342/21, 22, 27, 28
See application file for complete search history.

(56) References Cited

U.S. PATENT DOCUMENTS

| | | | | |
|---|---|---|---|---|
| 6,177,903 | B1 | 1/2001 | Fullerton et al. | |
| 6,466,157 | B1 * | 10/2002 | Bjornholt | G01S 7/032 340/552 |
| 9,008,584 | B2 * | 4/2015 | Alexander | G01S 13/003 340/552 |
| 9,229,102 | B1 | 1/2016 | Wright et al. | |
| 10,613,213 | B2 | 4/2020 | Silverstein et al. | |

(Continued)

FOREIGN PATENT DOCUMENTS

| | | |
|---|---|---|
| CN | 114236533 | 3/2022 |
| KR | 102557458 | 7/2023 |

OTHER PUBLICATIONS

U.S. Appl. No. 18/464,567, filed Sep. 11, 2023.

*Primary Examiner* — Bernarr E Gregory
(74) *Attorney, Agent, or Firm* — Treyz Law Group; Jason Tsai

(57) ABSTRACT

An electronic device may include radio-frequency sensing circuitry that transmits sensing signals and that receives reflected signals using one or more antennas. The sensing circuitry may generate digital sensor data based on the reflected signals. The sensor data may be indicative of moving objects moving through positions that occlude lines of sight between the electronic device and stationary objects behind the moving objects. The sensor circuitry may detect the locations on the stationary objects based on changes to the sensor data associated with motion of the moving objects through the positions. The sensor circuitry may accumulate an environment map of the detected locations as the moving objects move about the environment over time. This may allow the sensor circuitry to generate the environment map with high spatial resolution using as few antennas as possible. The sensor circuitry may detect boundaries of the environment based on the environment map.

19 Claims, 13 Drawing Sheets

(56) References Cited

U.S. PATENT DOCUMENTS

| | | | | |
|---|---|---|---|---|
| 10,656,259 | B2 | 5/2020 | Schar | |
| 11,175,147 | B1 | 11/2021 | Olmstead et al. | |
| 11,782,124 | B2 | 10/2023 | Van Haver et al. | |
| 2007/0222663 | A1* | 9/2007 | Humphrey | G01S 13/42 340/552 |
| 2017/0356991 | A1 | 12/2017 | Yosoku et al. | |
| 2019/0084525 | A1* | 3/2019 | Ignaczak | G01S 7/022 |
| 2019/0250262 | A1 | 8/2019 | Nagaraj et al. | |
| 2019/0310360 | A1* | 10/2019 | Hershkowitz | G01S 13/52 |
| 2020/0264278 | A1 | 8/2020 | Eckert et al. | |
| 2022/0381895 | A1 | 12/2022 | Hur et al. | |
| 2022/0381900 | A1 | 12/2022 | Hur et al. | |
| 2023/0018686 | A1 | 1/2023 | Shin et al. | |
| 2023/0296751 | A1 | 9/2023 | Forbes et al. | |
| 2023/0319504 | A1 | 10/2023 | Raj et al. | |
| 2023/0327929 | A1 | 10/2023 | Schrattenecker et al. | |

* cited by examiner

ELECTRONIC DEVICES WITH MOTION-BASED RADIO-FREQUENCY ENVIRONMENT MAPPING

FIELD

This disclosure relates generally to electronic devices and, more particularly, to electronic devices with wireless circuitry.

BACKGROUND

Electronic devices are often provided with wireless capabilities. An electronic device with wireless capabilities has wireless circuitry that includes one or more antennas. The wireless circuitry is sometimes used to perform wireless sensing operations in which radio-frequency signals are used to detect objects around the device.

If care is not taken, the wireless sensing operations may not exhibit sufficient resolution given the limited resources available at the electronic device.

SUMMARY

An electronic device may include wireless circuitry controlled by one or more processors. The wireless circuitry may include communications circuitry for performing wireless communications. The wireless circuitry may include sensing circuitry for performing range detection on an external object. The sensing circuitry may transmit sensing signals using one or more antennas. The sensing circuitry may receive corresponding reflected signals using the one or more antennas.

The sensing circuitry may generate digital sensor data based on the reflected signals received using the one or more antennas. The sensor data may be indicative of one or more moving objects moving through positions that occlude lines of sight between the electronic device and one or more stationary objects behind the moving objects. The sensor circuitry may detect the locations on the one or more stationary objects based on changes to the sensor data associated with motion of the one or more moving objects into and/or out of the positions between the device and the stationary objects (e.g., perturbations of the magnitude and/or phase of the sensor data generated from signals reflected off the stationary object(s), where the perturbations are produced by the motion of the moving object(s)). The sensor circuitry may, for example, include a moving target indicator (MTI) filter that filters out stationary portions of the sensor data (e.g., portions not perturbed by the moving object(s)) while preserving only the portions of the sensor data that exhibit changes due to the object(s) moving into and/or out of the positions in the foreground between the device and the stationary object(s).

The sensor circuitry may accumulate an environment map of the detected locations as the moving objects move about the environment around the device over time. This may allow the sensor circuitry to generate the environment map with higher spatial resolution than directly measuring reflections off each of the locations on the stationary objects, while using as few antennas as possible, thereby minimizing device resource consumption and cost. The sensor circuitry may detect edges or boundaries of the environment based on the environment map. The sensor circuitry may, for example, fit different environment boundary models to the environment map and may detect the edges or boundaries as the best-fitting environment boundary model. The device may perform any desired actions based on the detected edges or boundaries of the environment.

An aspect of the disclosure provides a method of operating an electronic device. The method can include transmitting, using one or more antennas, radio-frequency signals into an environment that contains a moving object and a stationary object. The method can include receiving, using the one or more antennas, reflected radio-frequency signals from the environment. The method can include detecting, using one or more processors, a boundary of the environment based on a motion, as identified from the reflected radio-frequency signals, of the moving object into a position between the electronic device and the stationary object.

An aspect of the disclosure provides an electronic device. The electronic device can include one or more antennas configured to transmit radio-frequency signals into an environment and configured to receive reflected signals from the environment. The electronic device can include one or more processors configured to accumulate a map of stationary objects in the environment based on changes in the reflected signals produced by movement of one or more moving objects through different positions between the electronic device and the stationary objects over time, and configured to identify a boundary of the environment based on the accumulated map of stationary objects.

An aspect of the disclosure provides a method of operating an electronic device. The method can include transmitting, using one or more antennas, sensing signals into an environment that contains a moving object and a stationary object. The method can include receiving, using the one or more antennas, reflected signals corresponding to the sensing signals. The method can include generating, using an analog-to-digital converter (ADC), sensing data based on the reflected signals. The method can include generating, using one or more processors, filtered data by applying a moving target indicator (MTI) filter to the sensing signals, wherein the filtered data is indicative of a movement of the moving object through a position between the electronic device and the stationary object. The method can include detecting, using the one or more processors, a location on the stationary object based on the movement of the moving object through the position between the electronic device and the stationary object.

DETAILED DESCRIPTION

Figure 1:
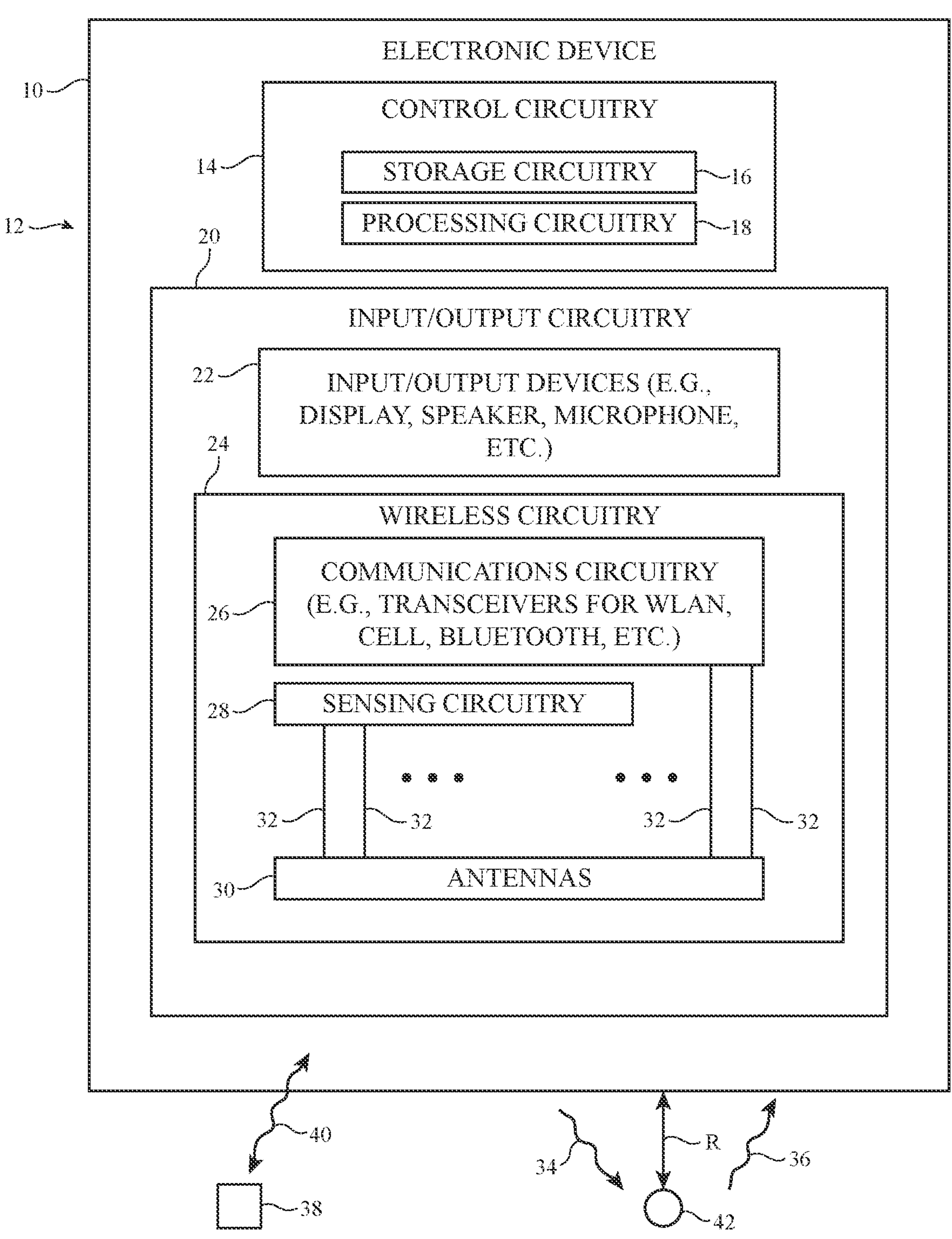
FIG. 1 is a schematic diagram of an illustrative electronic device having wireless sensing circuitry that performs motion-based environment mapping in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head (e.g., virtual, mixed, and/or augmented reality goggles or glasses), or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker or other media device, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, part or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors such as microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, 6G protocols, etc.), antenna diversity protocols, satellite navigation system protocols (e.g., global positioning system (GPS) protocols, global navigation satellite system (GLONASS) protocols, etc.), antenna-based spatial ranging (e.g., radio detection and ranging (radar)) protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), temperature sensors, etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications and wireless sensing operations. Wireless circuitry 24 (sometimes referred to herein as wireless communications circuitry 24) may include two or more antennas 30. Wireless circuitry 24 may also include baseband processor circuitry, transceiver circuitry, amplifier circuitry, filter circuitry, switching circuitry, analog-to-digital converter (ADC) circuitry, digital-to-analog converter (DAC) circuitry, radio-frequency transmission lines, and/or any other circuitry for transmitting and/or receiving radio-frequency signals using antennas 30.

Antennas 30 may be formed using any desired antenna structures for conveying radio-frequency signals. For example, antennas 30 may include antennas with resonating elements that are formed from loop antenna structures, patch antenna structures, inverted-F antenna structures, slot antenna structures, planar inverted-F antenna structures, helical antenna structures, dielectric resonator antenna structures, monopole antenna structures, dipole antenna structures, hybrids of these designs, etc. Filter circuitry, switching circuitry, impedance matching circuitry, and/or other antenna tuning components may be adjusted to adjust the frequency response and wireless performance of antennas 30 over time. If desired, two or more of antennas 30 may be integrated into a phased antenna array (sometimes referred to herein as a phased array antenna) in which each of the antennas conveys radio-frequency signals with a respective phase and magnitude that is adjusted over time so the radio-frequency signals constructively and destructively interfere to produce a signal beam in a given beam pointing direction.

The term "convey radio-frequency signals" as used herein means the transmission and/or reception of the radio-frequency signals (e.g., for performing unidirectional and/or bidirectional wireless communications with external wireless communications equipment and/or for performing wireless sensing). Antennas 30 may transmit the radio-frequency signals by radiating the radio-frequency signals into free space (or to free space through intervening device structures such as a dielectric cover layer). Antennas 30 may additionally or alternatively receive the radio-frequency signals from free space or through intervening devices structures such as a dielectric cover layer. The transmission and reception of radio-frequency signals by antennas 30 each involve the excitation or resonance of antenna currents on an antenna resonating element in the antenna by the radio-frequency signals within the frequency band(s) of operation of the antenna.

Wireless circuitry 24 may include communications circuitry 26 (sometimes referred to herein as wireless communications circuitry 26) for transmitting and/or receiving wireless communications data using antennas 30 (e.g., using wireless signals 40 conveyed with external equipment 38 such as a wireless access point or base station). Communications circuitry 26 may include baseband circuitry (e.g., one or more baseband processors) and one or more radios (e.g., radio-frequency transceivers, modems, etc.) for conveying radio-frequency signals using one or more antennas 30. Communications circuitry 26 may use antennas 30 to transmit and/or receive radio-frequency signals that convey the wireless communications data between device 10 and external equipment 38 (e.g., one or more other devices such as device 10, a wireless access point or base station, etc.). The wireless communications data may be conveyed bidirectionally or unidirectionally. The wireless communications data may, for example, include data that has been encoded into corresponding data symbols, frames, and/or packets such as wireless data associated with a telephone call, streaming media content, internet browsing, wireless data associated with software applications running on device 10, email messages, etc.

Wireless circuitry 24 may transmit and/or receive radio-frequency signals within corresponding frequency bands at radio frequencies (sometimes referred to herein as communications bands or simply as "bands"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, cellular sidebands, 6G bands between 100-1000 GHz (e.g., sub-THz, THz, or THF bands), etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, industrial, scientific, and medical (ISM) bands such as an ISM band between around 900 MHz and 950 MHz or other ISM bands below or above 1 GHz, one or more unlicensed bands, one or more bands reserved for emergency and/or public services, and/or any other desired frequency bands of interest.

In addition to conveying wireless communications data, wireless circuitry 24 may also use antennas 30 to perform wireless sensing operations (sometimes referred to herein as radio-frequency sensing operations, radio-based sensing operations, spatial ranging operations, radio detection and ranging (radar) operations, or simply as sensing operations). The wireless sensing operations may allow device 10 to detect (e.g., sense or identify) the presence, location, orientation, and/or velocity (motion) of objects external to device 10 such as external objects 42. Detecting, sensing, or identifying the presence, location, orientation, and/or velocity (motion) of external objects 42 at any given time or over a given time period may sometimes be referred to herein simply as detecting the external object or performing spatial ranging operations, ranging operations, radio-based sensing operations, or range detection. The sensing operations may be performed over a relatively short range such as ranges of a few mm or cm from antennas 30 or over longer ranges such as ranges of dozens of cm, a few meters, dozens of meters, etc.

External objects 42 may include, for example, the ground, a building, part of a building, a wall, a floor, furniture, a ceiling, a person, a body part (e.g., the head, hand, finger, or other body part of the user of device 10 or other humans in the vicinity of device 10), an animal, a vehicle, a landscape or geographic feature, an obstacle, external communications equipment, another device of the same type as device 10 or a peripheral/accessory device such as a gaming controller, stylus (e.g., for providing input to a touch and/or force-sensitive display on device 10), or remote control, or any other physical object or entity that is external to device 10.

External objects 42 may include one or more animate objects (e.g., an external object that is living and/or in motion within its own reference frame) and/or one or more inanimate objects (e.g., objects that are non-living and/or stationary within its own reference frame). External objects 42 may include one or more stationary objects that are at a fixed location, position, and/or orientation with respect to device 10 while device 10 is stationary and/or may include one or more moving objects that change location, position, and/or orientation with respect to device 10 while device 10 is stationary (e.g., that are in a reference frame that is in motion relative to the reference frame of device 10). Moving objects may include animate objects and/or inanimate objects (e.g., the moving objects need not be living).

External objects 42 are sometimes also referred to herein as target objects 42 or targets 42. The wireless (radio-frequency) sensing performed by sensing circuitry 28 may include target (object) detection on external objects 42. As used herein, target detection, object detection, radio-frequency sensing, wireless sensing, or detecting external objects 42 involve the detection, monitoring, measurement, and/or sensing, by sensing circuitry 28, of a selected characteristic of external objects 42 using radio-frequency signals conveyed using one or more antennas 30. The characteristic may be the presence or absence of external objects (e.g., at or adjacent to device 10, at a particular position relative to device 10, within a threshold range of device 10, at an expected position, etc.), the location, position, velocity, speed, movement, rotation, and/or orientation of external objects 42 (e.g., over time), the occlusion of other objects behind external objects 42 from device 10, the distance between device 10 and external objects 42 (sometimes referred to herein as range R), that external objects 42 include an expected or particular type of object as opposed to another type of object (e.g., to verify or authenticate that an external object 42 is a particular object instead of a different object, that external object 42 is formed from a particular material and not another material, etc.), a particular motion or movement of external objects 42 (e.g., a gesture or action performed by external objects 42 that matches a predetermined gesture or action), that external objects 42 include animate, inanimate, stationary, and/or moving objects, and/or any other information associated with external objects 42.

Control circuitry 14 may use the detection of external objects 42 (e.g., detection of the selected characteristic of external objects 42) to perform any desired device operations. As examples, control circuitry 14 may use the detection of external objects 42 to identify a corresponding user input for one or more software applications running on device 10 such as a gesture input performed by the user's hand(s) or other body parts or performed by an external stylus, gaming controller, head-mounted device, or other peripheral devices or accessories, to determine when one or more antennas 30 needs to be disabled or provided with a reduced maximum transmit power level (e.g., for satisfying regulatory limits on radio-frequency exposure when an external object 42 is a body part located within a threshold range of device 10), to determine how to steer a radio-frequency signal beam produced by antennas 30 for communications circuitry 26 (e.g., in scenarios where antennas 30 include a phased array of antennas 30), to map or model the environment around device 10 (e.g., to produce a software model of the room where device 10 is located for use by an augmented reality application, gaming application, map application, home design application, engineering application, etc.), to detect the presence of obstacles in the vicinity of (e.g., around) device 10 or in the direction of motion of the user of device 10, etc. Implementations in control circuitry 14 maps or models the environment around device 10 using the detection of external objects 42 by wireless circuitry 24 are described herein as an example.

Wireless circuitry 24 may include wireless sensing circuitry 28 for performing wireless sensing operations using antennas 30. Wireless sensing circuitry 28 is sometimes also referred to herein as wireless sensor 28, radio-frequency sensor 28, or simply as sensing circuitry 28. Sensing circuitry 28 may include a sensing transmitter (e.g., transmitter circuitry including signal generators, synthesizers, etc.), a sensing receiver, mixer circuitry, amplifier circuitry, filter circuitry, baseband circuitry, ADC circuitry, DAC circuitry, and/or any other desired components used in performing sensing operations using antennas 30. Sensing circuitry 28 may perform the sensing operations using radio-frequency sensing signals such as sensing signals 34 that are transmitted by antennas 30 (sometimes referred to herein as radar signals 34 when transmitted using a radar scheme) and using reflected (back-scattered) versions of the transmitted sensing signals that have reflected off an external object around device 10 such as external object 42 (sometimes referred to herein as reflected sensing signals 36, reflected signals 36, or reflected radar signals 36).

Sensing circuitry 28 may, for example, transmit and receive radar signals using a frequency-modulated continuous-wave (FMCW) radar scheme, a full-duplex ranging scheme, an orthogonal frequency division multiplexing (OFDM) radar scheme, a phase-modulated continuous-wave (PMCW) radar scheme, a stepped frequency continuous wave (SFCW) radar scheme, a pulse radar scheme, or other ranging schemes. Sensing circuitry 28 need not transmit and receive signals 34 and 36 using a radar scheme and may, if desired, transmit and receive signals 34 and 36 using any desired radio-based sensing scheme. Antennas 30 may include separate antennas for conveying wireless communications data for communications circuitry 26 and for conveying radar signals or may include one or more antennas 30 that are used to both convey wireless communications data and to perform sensing operations. Using a single antenna 30 to both convey wireless communications data and perform sensing operations may, for example, serve to minimize the amount of space occupied in device 10 by antennas 30.

Sensing circuitry 28 may be coupled to antennas 30 over at least two radio-frequency transmission line paths 32. Communications circuitry 26 may be coupled to antennas 30 over at least one radio-frequency transmission line path 32. Separate radio-frequency transmission line paths 32 may couple sensing circuitry 28 and communications circuitry 26 to antennas 30 (e.g., as shown in FIG. 1) or one or more radio-frequency transmission line paths 32 may couple one or more antennas 30 to both sensing circuitry 28 and communications circuitry 26. If desired, sensing circuitry 28 may be integrated into communications circuitry 26 (e.g., communications circuitry 26 may also perform spatial ranging operations using a joint communication and sensing (JCAS) scheme).

Radio-frequency transmission line paths 32 may include coaxial cables, microstrip transmission lines, stripline transmission lines, edge-coupled microstrip transmission lines, edge-coupled stripline transmission lines, transmission lines formed from combinations of transmission lines of these types, etc. Radio-frequency transmission line paths 32 may be integrated into rigid and/or flexible printed circuit boards if desired. Radio-frequency front end (RFFE) modules may be interposed on one or more radio-frequency transmission line paths 32. The radio-frequency front end modules may include substrates, integrated circuits, chips, or packages that are separate from sensing circuitry 28 and communications circuitry 26 and may include filter circuitry, switching circuitry, amplifier circuitry, impedance matching circuitry, radio-frequency coupler circuitry, and/or any other desired radio-frequency circuitry for operating on the radio-frequency signals conveyed over radio-frequency transmission line paths 32.

The example of FIG. 1 is illustrative and non-limiting. While control circuitry 14 is shown separately from wireless circuitry 24 in the example of FIG. 1 for the sake of clarity, wireless circuitry 24 may include processing circuitry (e.g., one or more processors) that forms a part of processing circuitry 18 and/or storage circuitry that forms a part of storage circuitry 16 of control circuitry 14 (e.g., portions of control circuitry 14 may be implemented on wireless circuitry 24). As an example, control circuitry 14 may include baseband circuitry (e.g., one or more baseband processors), digital control circuitry, analog control circuitry, and/or other control circuitry that forms part of communications circuitry 26 and/or sensing circuitry 28. The baseband circuitry may, for example, access a communication protocol stack on control circuitry 14 (e.g., storage circuitry 20) to: perform user plane functions at a PHY layer, MAC layer, RLC layer, PDCP layer, SDAP layer, and/or PDU layer, and/or to perform control plane functions at the PHY layer, MAC layer, RLC layer, PDCP layer, RRC, layer, and/or non-access stratum layer. If desired, the PHY layer operations may additionally or alternatively be performed by radio-frequency (RF) interface circuitry in wireless circuitry 24.

Figure 2:
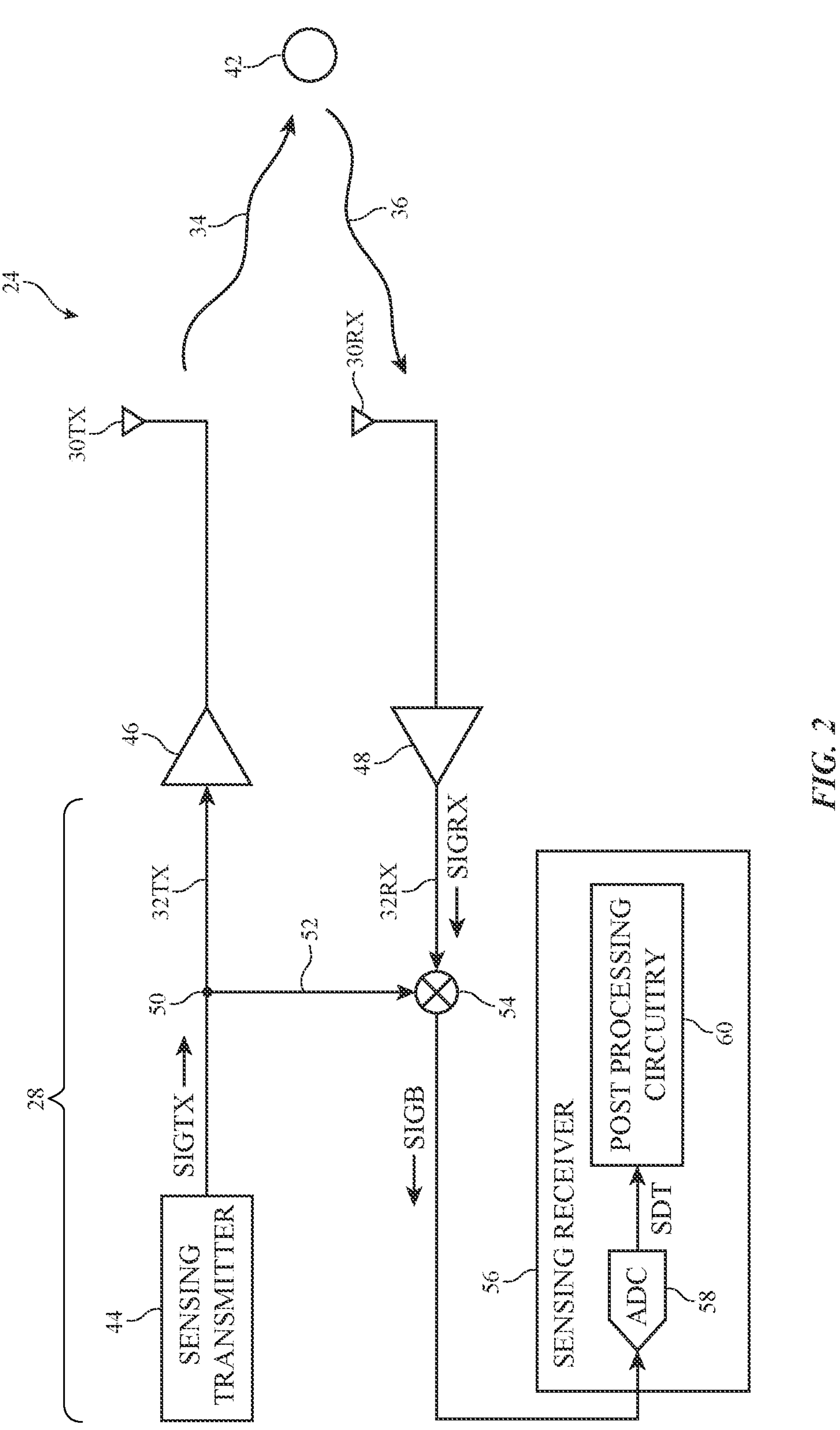
FIG. 2 is a circuit diagram of illustrative wireless sensing circuitry that performs motion-based environment mapping using radio-frequency signals conveyed by one or more antennas in accordance with some embodiments.

FIG. 2 is a circuit diagram of sensing circuitry 28. As shown in FIG. 2, sensing circuitry 28 may include at least one sensing transmitter 44 and at least one sensing receiver 56. The output of sensing transmitter 44 may be communicably coupled to a first antenna 30 such as antenna 30TX (sometimes referred to herein as transmit antenna 30TX) over radio-frequency transmission line path 32TX (sometimes referred to herein as transmit path 32TX or transmit chain 32TX). The input of sensing receiver 56 may be communicably coupled to a second antenna 30 such as antenna 30RX (sometimes referred to herein as receive antenna 30RX) over radio-frequency transmission line path 32RX (sometimes referred to herein as receive path 32RX or receive chain 32RX). One or more amplifiers such as power amplifier 46 may be disposed on transmit path 32TX between sensing transmitter 44 and transmit antenna 30TX. One or more amplifiers such as low noise amplifier 48 may be disposed on receive path 32RX between receive antenna 30RX and sensing receiver 56.

If desired, transmit antenna 30TX may also be used to transmit and/or receive radio-frequency signals that convey wireless communications data for communications circuitry 26 (FIG. 1). Similarly, if desired, receive antenna 30RX may also be used to transmit and/or receive radio-frequency signals that convey wireless communications data for communications circuitry 26. The transmit antenna and the receive antenna may be the same antenna or portions of the same antenna if desired (e.g., sensing transmitter 44 and sensing receiver 56 may be coupled to a single antenna over transmit path 32TX and receive path 32RX respectively). In general, sensing circuitry 28 may use a set of one or more antennas 30 to perform radio-frequency sensing.

Sensing transmitter 44 may transmit radio-frequency sensing signals SIGTX over transmit path 32TX and antenna 30TX. Power amplifier 46 amplifies the sensing signals SIGTX on transmit path 32TX. Sensing signals SIGTX may include any desired signals or waveforms for performing spatial ranging operations (e.g., chirp signals, one or more tones, continuous waves of radio-frequency energy, other radar waveforms, etc.). Sensing signals SIGTX may be transmitted using any desired carrier frequencies (e.g., frequencies greater than 10 GHz, greater than 20 GHz, less than 60 GHz, less than 10 GHz, less than 6 GHz, less than 1 GHz, greater than 100 GHz, etc.).

An implementation in which sensing signals SIGTX include chirp signals is described herein as an example. Chirp signals include frequency ramps (sometimes referred to as chirps) that periodically ramp up or down over time. In this example, sensing transmitter 44 may include a signal generator or synthesizer (e.g., a digital chirp generator) that generates the chirp signals and provides the chirp signals to a digital-to-analog converter (DAC) in sensing transmitter 44. The DAC converts the chirp signals to the analog domain and provides the analog chirp signals to a mixer in sensing transmitter 44. The mixer up-converts the analog chirp signals to radio frequencies (as sensing signals SIGTX) using a clocking signal such as a local oscillator signal produced by a local oscillator (LO) in sensing transmitter 44. Antenna 30TX radiates sensing signals SIGTX as sensing signals 34 (e.g., wireless radio-frequency signals having a radar waveform or another sensing waveform). Unlike the radio-frequency signals transmitted by communications circuitry 26 of FIG. 1, sensing signals SIGTX and sensing signals 34 may be free from wireless communications data (e.g., cellular communications data packets, WLAN communications data packets, etc.).

Sensing signals 34 may reflect off objects external to device 10 (e.g., external object 42) as reflected signals 36. As shown in FIG. 2, sensing circuitry 28 may include a mixer such as mixer 54 disposed on receive path 32RX between low noise amplifier 48 and sensing receiver 56. Mixer 54 may have a first input coupled to node 50 on transmit path 32TX over de-chirp path 52. Node 50 may be disposed on transmit path 32TX between sensing transmitter 44 and power amplifier 46, for example. Mixer 54 may have a second input coupled to the output of low noise amplifier 48. The output of mixer 54 may be coupled to the input of sensing receiver 56. Mixer 54 is sometimes also referred to herein as de-chirp mixer 54. Low noise amplifier 48 may be omitted if desired.

Receive antenna 30RX may receive reflected signals 36 (e.g., a reflected version of sensing signals 34 that has reflected off external object 42 or and/other external objects) and may pass the reflected signals to mixer 54 via receive path 32RX and low noise amplifier 48 (e.g., as received sensing signals SIGRX). Received sensing signals SIGRX may include the sensing signals SIGTX (e.g., chirp signals) that have reflected off external object 42 and that have been received by receive antenna 30RX. Node 50 on transmit path 32TX may include a radio-frequency signal coupler or signal splitter that couples some of the sensing signals SIGTX propagating along transmit path 32TX onto de-chirp path 52. If desired, one or more amplifiers (not shown) may be disposed on de-chirp path 52 to boost the amplitude of the sensing signals SIGTX provided to de-chirp mixer 54.

De-chirp mixer 54 may receive sensing signals SIGRX at its second input (e.g., from low noise amplifier 48). De-chirp mixer 54 may mix the sensing signals SIGTX received at its first input (over de-chirp path 52) with the received sensing signals SIGRX received at its second input (over receive path 32RX) to produce or generate signals SIGB at baseband or an intermediate frequency. Signals SIGB may correspond to beats associated with the difference in phase between the transmitted sensing signals SIGTX and the received sensing signals SIGRX. Signals SIGB may therefore sometimes be referred to herein as beat signals SIGB. If desired, additional mixers (not shown) may be disposed on receive path 32RX between de-chirp mixer 54 and sensing receiver 56 for further downconverting beat signals SIGB to baseband in implementations where de-chirp mixer 54 outputs the beat signals at an intermediate frequency.

Sensing receiver 56 may receive beat signals SIGB from de-chirp mixer 54. Sensing receiver 56 may include an analog-to-digital converter (ADC) that converts beat signals SIGB from the analog domain to the digital domain, as digital sensing data SDT. Sensing data SDT may have any desired data format. As one example, sensing data SDT may include a radar data cube of sensing data. The data cube is a three-dimensional representation (matrix) of the data output by ADC 58. The data cube has orthogonal spatial, fast time, and slow time axes. Different points or bins along the spatial axis correspond to different receive antennas 30RX used to receive reflected signals 36 (e.g., when multiple receive antennas are used to receive reflected signals 36). Different points or bins along the fast time axis correspond to different time ADC samples of the received sensing signals SIGRX produced by given pulse (e.g., one chirp) in sensing signals SIGTX. Different points or bins along the slow time axis correspond to different transmitted pulses in sensing signals SIGTX (e.g., N chirps over a single frame). Sensing circuitry 28 may capture multiple frames (data cubes) over time. Each frame may have a corresponding frame duration. The time interval between the frames is referred to as the frame repetition interval (FRI). Other data structures may be used for sensing data SDT if desired. Sensing receiver 56 may include post processing circuitry 60 that receives sensing data SDT from ADC 58. Post processing circuitry 60 may process sensing data SDT to perform object detection on external objects 42.

If desired, two or more of the antennas 30 used by sensing circuitry 28 may be integrated into a radar module (e.g., in an array such as a phased antenna array). Each antenna may transmit, receive, or transmit and receive sensing signals. Each of the antennas in the module may be synchronized in time, frequency, and phase (e.g., using the same LO distribution). The spacing between the antennas in the module may be uniform or non-uniform (e.g., in a MIMO radar arrangement). The module may have beamforming, mono-static, multi-static, and/or MIMO capabilities. The antennas may be arranged in a one-dimensional, two-dimensional, or three-dimensional pattern in the array. The antennas may share a local oscillator, waveform synthesizer (e.g., sensing transmitter 44), control and timing units, memory, and/or processing circuitry (e.g., sensing receiver 56).

In implementations where sensing signal SIGTX is a chirp waveform (e.g., under an FCMW architecture), the chirp waveform may periodically sweep (e.g., linearly ramp) up or down in frequency across the bandwidth of the chirp as a function of time. In these implementations, the reflected (back-scattered) signals are a delayed and attenuated version of the transmitted signal that are then mixed with the transmitted signal at de-chirp mixer 54.

As an example, when external object 42 is at a range of $R(\tau)=R_0+\Delta R(\tau)$, where $\tau$ is the roundtrip time delay of the transmitted and reflected signal (e.g., where $R=c*\tau/2$ and c is the speed of light), beat signal SIGB may be given by the equation $x(t,\tau)\cong\exp(-j*(4*\pi/\lambda)*R(\tau))*\exp(-j*2*\pi*f_b(\tau)*t)$, where the first exponential term specifies the phase, the second exponential term specifies the frequency, $\lambda$ is the carrier wavelength, and $f_B$ is the beat frequency having a resolution determined by the chirp bandwidth (e.g., where $f_B\cong k*(2*R_0/c)$ and k is the slope of the transmitted chirp signal).

In this example, the accuracy for the estimation of target range R through estimation of beat signal SIGB at frequency $f_B$ is determined by the Rayleigh resolution limit $R_{res}$, which is inversely proportional to the bandwidth B of the chirp signal (e.g., $R_{res}=c/(2*B)$). For example, a bandwidth of B=1 GHz may provide a range resolution of approximately 15 cm. This may be suitable for detecting the overall location of the target and/or to separate the objects/reflectors located at different ranges. At the same time, the sensitivity for the estimation of the phase of beat signal SIGB is inversely proportional to the wavelength of the RF carrier (e.g., where phase $\Delta\phi=(4*\pi/k)*\Delta R$), which makes phase detection suitable for fine-grain estimation of variations in the range of the target. For example, when the carrier frequency is 60 GHz (corresponding to a wavelength of approximately 5 mm), the detectable target range variation $\Delta R$=1.25 mm leads to a 180 degree phase rotation of beat signal SIGB. These examples are illustrative and non-limiting and, in general, sensing circuitry 28 may implement any desired radio-frequency sensing scheme. While sensing circuitry 28 is illustrated in FIG. 2 as implementing a continuous wave (CW) architecture, sensing circuitry 28 may implement any desired spatial ranging and/or radar architecture.

If desired, sensing circuitry 28 may use signals 34 and 36 to detect and spatially map the surroundings or environment of device 10. This process is sometimes referred to herein environment mapping, environmental mapping, or room mapping. When performing environment mapping, device 10 may generate an environment map based on signals 34 and 36 (e.g., based on external objects 42 that are detected using signals 34 and 36). The environment map identifies the spatial locations of the different objects detected around device 10. If desired, environment mapping may also include the identification or detection of spatial boundaries within the environment map and around device 10.

Figure 3:
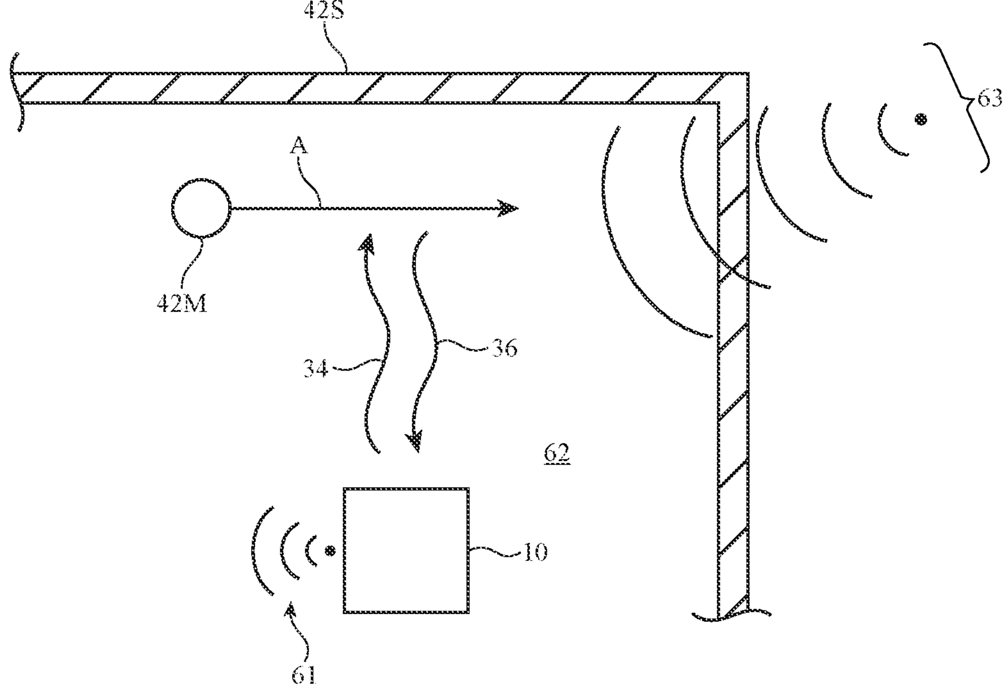
FIG. 3 is a top view of an environment in which an illustrative electronic device performs motion-based environment mapping in accordance with some embodiments.

FIG. 3 is a top view of an illustrative environment in which device 10 may perform environment mapping. As shown in FIG. 3, device 10 may be located in an environment 62. Environment 62 may be a geographic area or region, an outdoor space, an indoor space, a room, a corridor, a hallway, an apartment, a house, a campus, an office, a cubicle, and/or any other desired spatial area at, surrounding, and/or around the location of device 10.

Environment 62 may include one or more external objects 42. The external objects 42 in environment 62 may include one or more stationary objects 42S and one or more moving objects 42M. When device 10 is stationary within environment 62, stationary objects 42S generally remain at a fixed position (e.g., are non-moving) relative to device 10. Stationary objects 42S include inanimate objects and may, if desired, include one or more stationary animate objects. On the other hand, moving objects 42M move, rotate, and/or change position and/or orientation relative to device 10 when device 10 is stationary within environment 62. Moving objects 42M may include moving animate objects (e.g., people, animals, etc.) and/or moving inanimate objects.

During wireless sensing, device 10 transmits sensing signals 34 into environment 62 and receives corresponding reflected signals 36 that have reflected off of external objects 42 in environment 62. Device 10 may use the reflected signals 36 that are received at device 10 after reflection off moving objects 42M to detect moving objects 42M. While device 10 is stationary in environment 62, moving objects 42M may pass between device 10 and stationary objects 42S. Stationary objects 42S may contribute a background or clutter signal to the reflected signals 36 received at device 10. Stationary objects 42S are therefore sometimes also referred to herein as background objects 42S, clutter objects 42S, or clutter 42S. Stationary objects 42S may include, for example, walls, ceilings, floors, doors, furniture, windows, and/or other stationary objects and/or physical boundaries of environment 62.

During environment mapping, the post processing circuitry 60 in sensing receiver 56 (FIG. 2) on device 10 generates an environment map RCM that maps the spatial position(s) (e.g., location(s) and/or orientation(s)) of the stationary objects 42S in environment 62. In other words, environment map RCM maps the spatial position of background objects or clutter in environment 62 (e.g., by mapping the energies returned from stationary objects 42S without including the spatial location of moving objects 42M). Environment map RCM is therefore sometimes also referred to herein as room clutter map RCM, clutter map RCM, background map RCM, or background object map RCM.

Device 10 may perform any desired operations based on environment map RCM. For example, device 10 may use environment map RCM as an input to one or more software applications running on device 10 (e.g., as executed by an application processor). In some implementations that are described herein as an example, the room mapping performed by device 10 also involves using environment map RCM to identify the edges or boundaries of environment 62. Device 10 may then perform any desired operations based on the identified boundaries of environment 62.

As one example, device 10 may use the boundaries to identify when radio-frequency signals 63 are incident upon device 10 from a source or location located outside of the boundaries of environment 62. These radio-frequency signals 63 may, for example, include wireless communications data and/or sensing signals transmitted by other devices located outside of environment 62 that are owned and/or operated by another user or entity, or may be signals transmitted by device 10 and reflected from an external object outside the boundaries. When device 10 identifies that radio-frequency signals 63 are incident upon device 10 from a source located outside of the identified boundaries of environment 62, device 10 may filter out or mask radio-frequency signals 63 from being received, decoded, demodulated, and/or provided to the user of device 10. This may, for example, help to preserve the privacy of the other users who may be operating the device(s) that produced radio-frequency signals 63.

As another example, device 10 (e.g., one or more input-output devices 22 of FIG. 1) may generate, produce, emit, alter, adjust, and/or modify a device output 61 based on the identified boundaries of environment 62. Device output 61 may include a visual output, a haptic output, a wireless, and/or an audio output, as example. The visual output may include light emitted by one or more light sources on device 10 and/or image and/or video data displayed by one or more displays on device 10. The visual output may include, for example, the generation and/or adjustment of virtual objects displayed by the display(s) on device 10 using a mapping, navigation, video playback, video streaming, gaming, augmented reality, mixed reality, and/or virtual reality application.

Consider an example in which device 10 includes an augmented and/or virtual reality display. In these examples, the display may display virtual content (e.g., virtual objects) to a user. The virtual content may include virtual content displayed or overlaid onto the detected boundaries of environment 62, may include virtual content displayed or overlaid onto a particular spatial position relative to the detected boundaries of environment 62, and/or may include virtual objects that represent the detected boundaries of environment 62 (e.g., virtual room boundaries) and that are placed into a displayed rendering environment 62 at the location of the detected boundaries of environment 62, as examples. This may allow the virtual content to be displayed with greater accuracy than in implementations where device 10 uses infrared light to detect the boundaries of environment 62. This is because depth sensing technology based on infrared light can have difficulty detecting glass walls or uniform-colored wall surfaces in environment 62. However, since device 10 receives reflected signals 36 from stationary objects 42 that include glass walls or uniform-colored wall surfaces (e.g., because sensing signals 34 reflect off glass or other surfaces regardless of color), device 10 may still successfully map boundaries of environment 62 even when the boundaries include the glass walls or uniform-colored wall surfaces, despite the difficulty of detecting such boundaries using infrared light.

The audio output may include, for example, sound emitted by a speaker on device 10 and/or wirelessly coupled to device 10 (e.g., speakers on wireless headphones, wireless earbuds, or a wireless speaker paired with device 10). The haptic output may include, for example, one or more vibrations produced by vibrators or other haptic devices on device 10. The wireless output may include, for example, wireless signals transmitted to another device that identify the detected boundaries of environment 62. In these implementations, the other device may emit output such as device output 61 based on the detected boundaries of environment 62.

If desired, the audio, haptic, and/or wireless output may include navigation instructions, warnings, alerts, directions, and/or other output based on the detected boundaries of environment 62. These outputs may, for example, help to describe to the user of device 10 where the boundaries of environment 62 are located and/or may alert the user when the user approaches or is near to one of the detected boundaries. These outputs may, for example, allow a vision-impaired user of device 10 to freely move through environment 62 without hitting the detected boundaries and without requiring the user to view the detected boundaries (e.g., stationary objects 42S). These examples are illustrative and non-limiting and, in general, device 10 may perform any desired operations and/or may produce any desired output based on the boundaries detected based on environment map RCM as generated while performing room mapping.

In general, it is desirable for environment map RCM to exhibit as high a spatial resolution as possible. This may, for example, maximize the accuracy with which device 10 identifies the boundaries of environment 62, thereby optimizing any later device operations performed based on the identified boundaries. In some implementations, a device with wireless sensing circuitry generates an environment map by directly measuring the distance between device 10 and each possible point on stationary objects 42S by transmitting sensing signals 34 to and receiving reflected signals 36 from each of those points on stationary objects 42S (e.g., by implementing beam steering arrangements in which a phased antenna array is used to transmit and/or receive sensing signals to/from each of the points). In these scenarios, increasing the number of antennas used to transmit/receive the sensing signals (e.g., the number of elements in the phased antenna array) reduces the minimum resolvable spacing between the points and thus the precision of the points, which serves to maximize the resolution of the environment map. For example, the environment map may exhibit an angular resolution of 9.6 degrees at boresight and 19.5 degrees at 60 degrees off boresight when the device generates the environment map using a uniform linear array of twelve antennas, but may exhibit a deteriorated angular resolution of 30 degrees at boresight and 90 degrees at 60 degrees off boresight when the device generates the environment map using a uniform linear array of four antennas.

On the other hand, space and resources are at a premium in compact devices such as device 10. Performing wireless sensing using twelve or more antennas 30 can consume an excessive amount of space in device 10, can cause device 10 to be excessively heavy or bulky, can cause device 10 to consume excessive chip space to support the antennas, can cause device 10 to consume excessive power, and/or can undesirably increase the cost of device 10. It would therefore be desirable for device 10 to be able to generate environment map RCM with as high a resolution as possible while minimizing the number of antennas used to convey signals 34 and 36. For example, it would be desirable for device 10 to be able to generate environment map RCM with fewer than twelve antennas 30 but with similar spatial resolution as when twelve or more antennas are used (e.g., 9.6 degrees or lower at boresight).

In implementations that are described herein as an example, device 10 mitigates these issues by performing motion-based environment mapping. Motion-based environment mapping is environment mapping based on the motion/movement of one or more moving objects 42M between device 10 and stationary objects 42S (e.g., as shown by arrow A of FIG. 3), rather than by directly sensing reflections off each point on stationary objects 42S. Such motion-based environment mapping may, for example, allow device 10 to generate environment map RCM with similar or higher resolution as when directly sensing stationary objects 42S using a large array of antennas, but while using as few as only a single transmit antenna 30TX and/or receive antenna 30RX to convey signals 34 and 36. The motion-based environment mapping may therefore allow device 10 to minimize its size, weight, cost, area consumption, and/or power consumption without sacrificing the accuracy with which it identifies the boundaries of environment 62.

Figure 4:
FIG. 4 is a schematic diagram of an illustrative receiver that includes a map generator and an environment boundary estimator for performing motion-based environment mapping in accordance with some embodiments.
Figure 4:
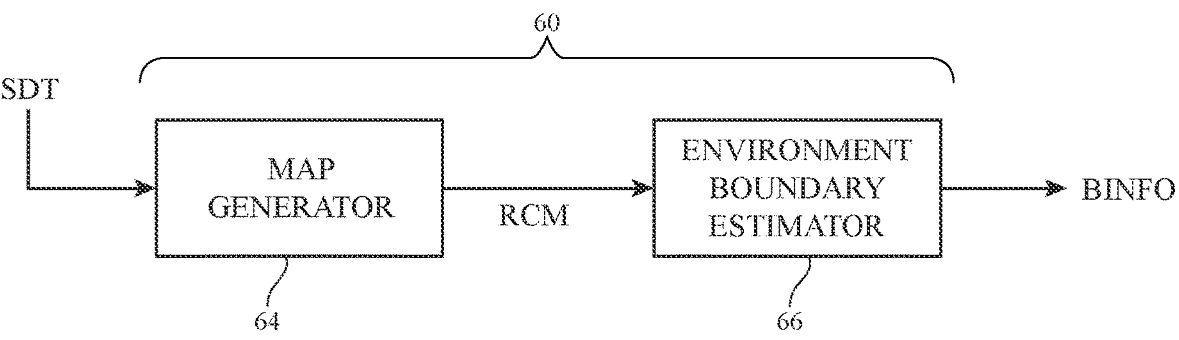

FIG. 4 is a schematic diagram of post processing circuitry 60 in sensing receiver 56 in implementations where device 10 performs motion-based environment mapping of environment 62. As shown in FIG. 4, post processing circuitry 60 may include a map generator such as map generator 64 and may include an environment boundary estimator such as environment boundary estimator 66. The input of map generator 64 may receive sensing data SDT from ADC 58 (FIG. 2). The output of map generator 64 may be coupled to the input of environment boundary estimator 66.

The components and functions of map generator 64 and environment boundary estimator 66 may be implemented using hardware (e.g., digital circuitry, sets of digital logic gates, registers, switches, filters, clocking circuitry, memory, etc.), firmware, and/or software (e.g., logic implemented in software, software code executed by one or more processors, etc.). If desired, the hardware may be controlled or operated by processing circuitry 18 of FIG. 1 (e.g., one or more processors. Map generator 64 is sometimes also referred to herein as map generator circuitry 64, map generator circuit 64, map generator logic 64, map generator engine 64, or map generator block 64. Environment boundary estimator 66 is sometimes also referred to herein as environment boundary estimator, identifier, or detector 66, environment boundary estimator, identifier, or detection circuitry 66, environment boundary estimator, identifier, or detector circuit 66, environment boundary estimator, identifier, or detector logic 66, environment boundary estimator, identifier, or detector engine 66, or environment boundary estimator, identifier, or detector logic 66.

While performing environment mapping, map generator 64 receives sensing data SDT (e.g., a stream of data samples from a series of one or more data cubes) from ADC 58 (FIG. 2). Map generator 64 may generate environment map RCM based on the motion of one or more moving objects 42M between device 10 and stationary objects 42S as included or identified in the received sensing data SDT. For example, when a moving object 42M (e.g., a human, pet, cleaning robot, etc.) moves between device 10 and different points on stationary objects 42S (as shown by arrow A of FIG. 3), the moving object temporarily blocks or occludes device 10 from different points on stationary objects 42S (e.g., blocks line of sight paths between device 10 and the different points on stationary objects 42S). This motion of moving object 42M to block and/or unblock stationary objects 42S may perturb the reflected signals 36 as reflected off of stationary objects 42S and received at device 10. Device 10 may use the motion associated with this temporary blockage (e.g., perturbations or changes to the reflected signals from stationary objects 42S due to moving object 42M moving into and/or out of the foreground between device 10 and stationary objects 42S) to detect the distance between device 10 and each of the different points on stationary objects 42S (and thus the location of stationary objects 42S).

Sensing data SDT includes sensing data produced from reflected signals 36 received after reflection off of stationary objects 42S. This portion of sensing data SDT is sometimes also referred to herein as the stationary signal or stationary sensing data of sensing data SDT. Motion of moving object 42M between device 10 and points on stationary objects 42S will cause some of the sensing data produced from reflection off stationary objects 42S (e.g., stationary sensor data) to exhibit a corresponding change or perturbation, while other portions of the stationary sensor data produced by reflection off points on stationary objects 42S that are not blocked by moving object 42M do not exhibit such changes or perturbations. Map generator 64 may include a moving target indicator (MTI) filter that passes only the portion of the received sensing data SDT that was produced by reflection off of stationary objects 42S (e.g., the stationary sensing data) and that includes changes or perturbations produced by motion of moving object 42M into and/or out of the foreground between device 10 and stationary objects 42S, while filtering out other portions of the sensing data without such changes or perturbations. When no movement exists between device 10 and stationary objects 42S (e.g., in the absence of moving objects 42M), all of the stationary sensing data is free of changes or perturbations from the motion of moving objects 42M between device 10 and stationary objects 42S, and therefore no signal is produced at the output of the MTI filter.

Put differently, when a moving object 42M moves through environment 62, the moving object will perturb the line of sight between device 10 and portions or points on stationary objects 42S. This motion and blockage perturbs the reflected signal 36 received at device 10 from portions of stationary objects 42S that are blocked by moving object 42M, which perturbs or changes that portion of the stationary sensing data as a function of time in sensing data SDT. This part of the stationary sensing data is not filtered out and is instead passed by the MTI filter. At the same time, the portions of the stationary sensing data produced from reflected signals received from other (non-occluded) portions of stationary objects 42S do not include the same perturbations or changes over time and are instead filtered out by the MTI filter. Therefore, the local clutter signal and thus the location of stationary objects 42S can be resolved from nearby competing signals. As the motion/trajectory of moving objects 42M progresses and covers different areas of stationary objects 42S from the perspective of device 10, map generator 64 may detect and accumulate the signal from different stationary objects 42S or different portions of stationary objects 42S into environment map RCM.

This type of motion-based environment mapping may, for example, serve to provide even higher spatial resolution than what is intrinsically produced by a phased antenna array having a large number of antennas that directly sense reflections from all portions of stationary objects 42S to map environment 62. This type of motion-based environment mapping may also, for example, allow device 10 to detect stationary objects 42S in far less time and with greater accuracy than simply detecting moving objects 42M (e.g., reflected signals 36 that have reflected off moving objects 42M) over time and then inferring the presence of stationary objects 42S as the locations where moving objects 42M have not traveled over a statistically significant time period (e.g., so-called "no-go" regions).

Environment boundary estimator 66 may estimate the edges or boundaries of environment 62 based on environment map RCM. Environment boundary estimator 66 may, for example, generate and output boundary information BINFO based on environment map RCM. Boundary information BINFO may include or identify, based on environment map RCM, the positions(s) (e.g., location(s) and/or orientation(s)) of stationary objects 42S, which may itself represent or identify the spatial boundaries of environment 62. Sensing receiver 56 may provide boundary information BINFO to other circuitry in device 10 (e.g., control circuitry 14 of FIG. 1) for further processing.

Figure 5:
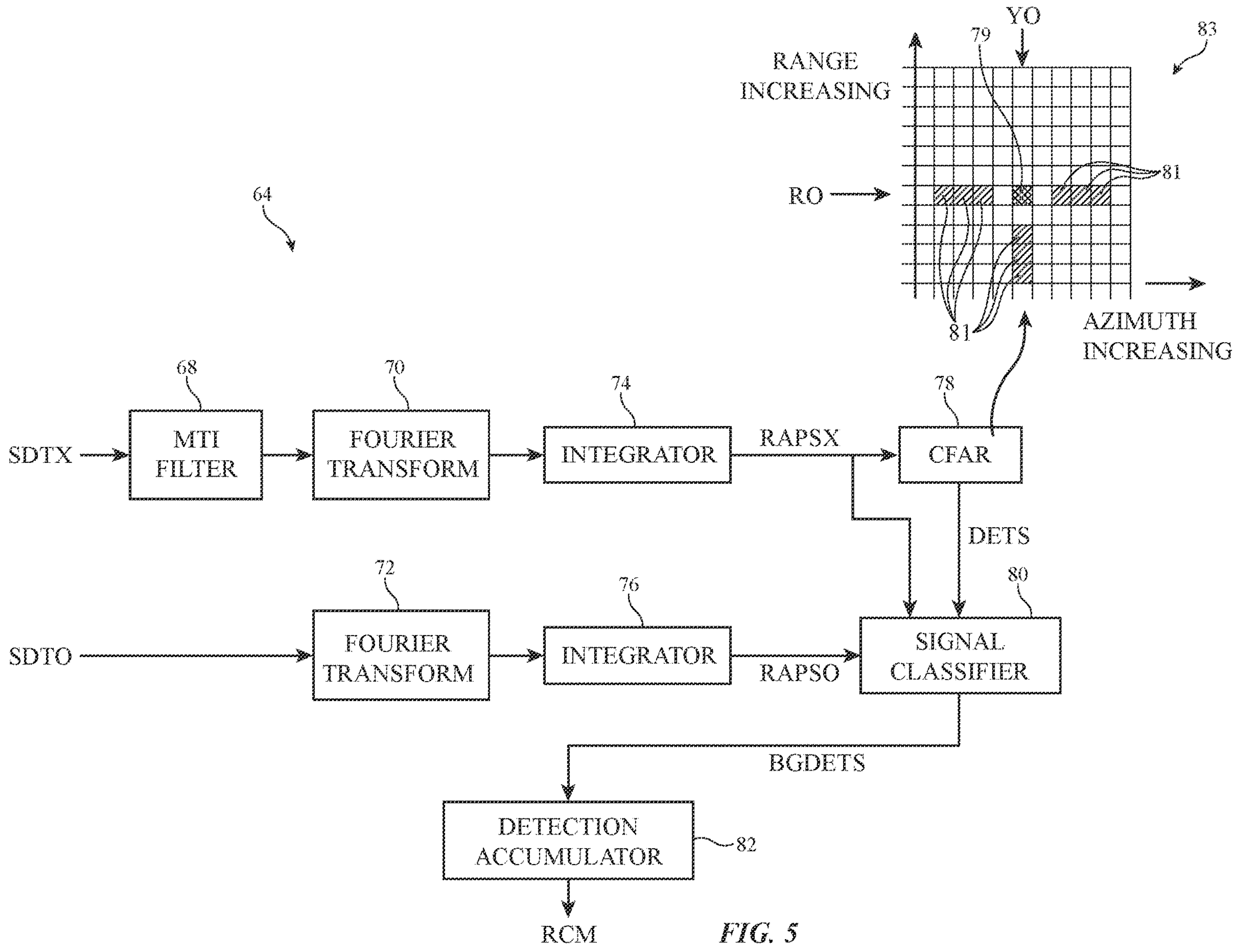
FIG. 5 is a schematic circuit diagram of an illustrative map generator in a receiver that performs motion-based environment mapping in accordance with some embodiments.

FIG. 5 is a schematic circuit diagram of map generator 64. As shown in FIG. 5, map generator 64 may include MTI filter circuitry such as MTI filter 68, Fourier transform circuitry such as a first Fourier transform 70 and a second Fourier transform 72, integrator circuitry such as a first integrator 74 and a second integrator 76, constant false alarm rate (CFAR) detection circuitry such as CFAR detector 78, signal classification circuitry such as signal classifier 80, and detection accumulation circuitry such as detection accumulator 82.

The sensing data SDT (FIG. 4) received from ADC 58 (FIG. 2) may include baseline sensing data SDT0 and real-time sensing data SDTX. Baseline sensing data SDT0 may include sensing data that is generated by sensing circuitry 28 when device 10 is stationary in environment 62 and when environment 62 is free from moving objects 42M. Baseline sensing data SDT0 may, for example, include one or more data cubes collected by sensing circuitry 28 when there are no moving objects 42M within environment 62. Baseline sensing data SDT0 may be generated at an initial time and/or may be updated over time if desired. Baseline sensing data SDT0 may be stored at storage circuitry on device 10 until processing by map generator 64. On the other hand, real-time sensing data SDTX includes sensing data for use in mapping environment 62 based on the motion of moving objects 42M between device 10 and stationary objects 42S. Real-time sensing data SDTX may be generated by sensing circuitry 28 after generation of baseline sensing data SDT0 (e.g., when one or more moving objects 42M are present and moving around environment 62). Map generator 64 may generate environment map RCM based on real-time sensing data SDTX and baseline sensing data SDT0.

MTI filter 68 may have an input that receives real-time sensing data SDTX. The output of MTI filter 68 may be coupled to the input of Fourier transform 70. The output of Fourier transform 70 may be coupled to the input of integrator 74. Alternatively, the location of MTI filter 68 and Fourier transform 70 may be reversed (e.g., the output of Fourier transform 70 may be coupled to the input of MTI filter 68). The output of integrator 74 may be coupled to the input of CFAR 78 and a first input of signal classifier 80. The output of CFAR 78 may be coupled to a second input of signal classifier 80. Fourier transform 72 may have an input that receives baseline sensing data SDT0. The output of Fourier transform 72 may be coupled to integrator 76. The output of integrator 76 may be coupled to a third input of signal classifier 80. The output of signal classifier 80 may be coupled to the input of detection accumulator 82. Detection accumulator 82 may output environment map RCM (e.g., for subsequent processing by environment boundary estimator 66).

During environment mapping, MTI filter 68 receives real-time sensing data SDTX and applies an MTI or high pass filter to real-time sensing data SDTX. The MTI filter passes a dynamic (e.g., changing or perturbed) portion of stationary sensing data in real-time sensing data SDTX (e.g., time samples of the signal produced by reflection off stationary objects 42S with a signal magnitude that changes at a rate having an absolute value exceeding a threshold rate). At the same time, the MTI filter blocks or filters out a static portion of the signal in real-time sensing data SDTX (e.g., a remainder of the time samples of the stationary sensing data, with a signal magnitude that changes at a rate having an absolute value less than or equal to the threshold rate). This may serve to filter out a first portion of the stationary sensing data produced by reflection of the sensing signals off stationary objects 42S that are not blocked by moving objects 42M while passing, to Fourier transform 70, only a second portion of the stationary sensing data having changes and/or perturbations over time produced by motion of a moving object 42M into and/or away from a position that occludes a corresponding point or location on stationary objects 42S.

Figure 6:
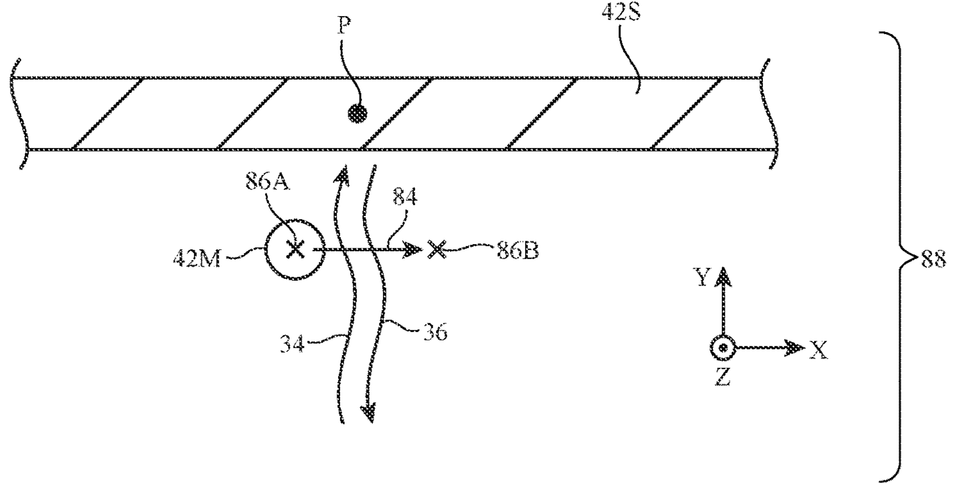
FIG. 6 is a diagram showing how occlusion of stationary objects by one or more moving objects affects the amplitude of a local signal at illustrative wireless sensing circuitry in accordance with some embodiments.
Figure 6:
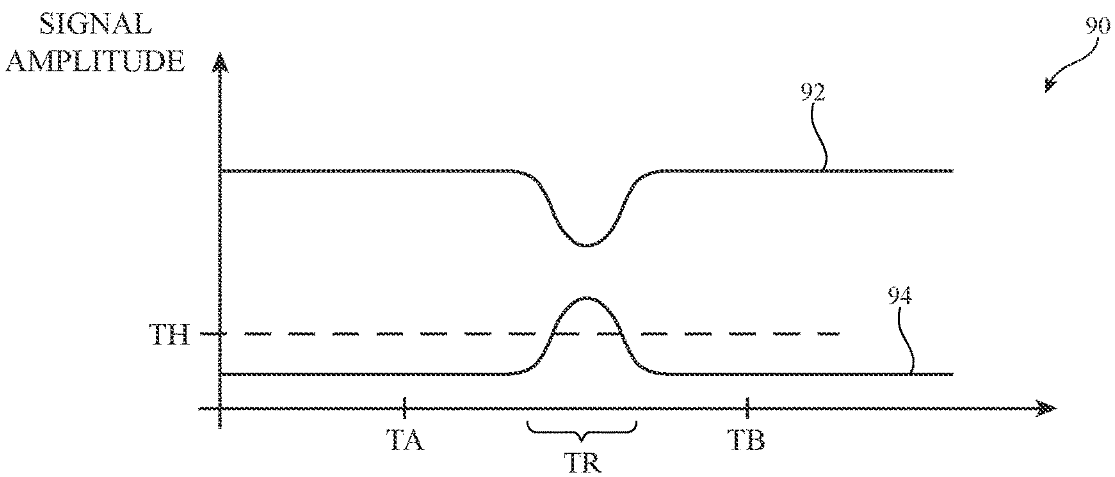

FIG. 6 is a diagram showing how moving object 42M may produce a signal in real-time sensing data SDTX that passes through MTI filter 68 to Fourier transform 70. Portion 88 of FIG. 6 illustrates the position of moving object 42M between stationary objects 42S and device 10 over time (e.g., while device 10 is stationary). As shown by portion 88 of FIG. 6, moving object 42M may be at an initial position 86A at a first time TA. Moving object 42M may be in motion in the direction of arrow 84 over time, such that moving object 42M arrives at position 86B at a second time TB after time TA. During environment mapping operations, device 10 may transmit sensing signals 34 and may receive corresponding reflected signals 36 from point P on stationary objects P (e.g., a reflected version of the transmitted sensing signals 34 that have reflected off stationary objects P). While illustrated as a point for the sake of clarity, point P has a finite width or point spread in practice.

Curve 92 of plot 90 in FIG. 6 plots the local signal amplitude (magnitude) in the stationary sensing data of the real-time sensing data SDT (e.g., coming from point P) received at MTI filter 68 as a function of time. Prior to time TA and after time TB, moving object 42M does not block or occlude point P from device 10. As shown by curve 92, the real-time sensing data SDTX produced from reflection off stationary objects 42S therefore exhibits a relatively constant magnitude (e.g., a rate of change with an absolute value less than a threshold level) prior to time TA and after time TB. Curve 94 of plot 90 plots the signal amplitude as output by MTI filter 68. The amplitude of curve 94 may correspond to the magnitude of the rate of change of curve 92 over time. As shown by curve 94, the output of MTI filter 68 is relatively low prior to time TA and after time TB because the signal magnitude associated with curve 92 is relatively constant before time TA and time TB.

Between time TA and time TB, moving object 42M moves into a position that occludes point P from device 10 and then moves out of the position that occludes point P from device 10. This motion of moving object 42M produces a change or perturbation (e.g., a reduction and then an increase) in magnitude between times TA and time TB (e.g., by a rate having an absolute value exceeding the threshold level), as shown by curve 92. However, the change in magnitude produced by motion of moving object 42M through the position blocking point P causes MTI filter 68 to output this portion of the signal with a relatively high magnitude, as shown by the peak in curve 94 between times TA and TB. MTI filter 68 may output or pass the portion of the signal exceeding a detection threshold TH (sometimes referred to herein as filtered sensor data or filtered data) to Fourier transform 70 while blocking the rest of the stationary sensor data from passing to Fourier transform 70. As such, Fourier transform 70 will only receive the portion (samples) of the signal output by MTI filter 68 having an amplitude that exceeds detection threshold TH (e.g., the portion of the signal in real-time sensor data SDTX received during time range TR between times TA and TB). These samples correspond to times when the amplitude associated with curve 92 exhibited a rate of change having an absolute value exceeding a threshold rate of change. In this way, MTI filter 68 passes only the portion of real-time sensor data SDTX that exhibits a change due to foreground moving object 42M moving in front of a background stationary object 42S, while filtering out the rest of the real-time sensor data including portions of the sensing data produced by reflected signals from portions of stationary objects 42S that are not blocked by moving objects 42M.

Fourier transform 70 may receive the filtered sensor data from MTI filter 68 (e.g., real-time sensor data SDTX that is output or passed through MTI filter 68). Fourier transform 70 may apply one or more discrete Fourier transforms (DFTs) to the filtered sensor data received from MTI filter 68 (e.g., over the fast time and spatial dimensions (axes) of the data cube in the real-time sensor data SDTX that passed MTI filter 68). This may, for example, convert the filtered sensor data from the time domain into the spatial domain (e.g., range and azimuth coordinates). Fourier transform 70 may output the converted filtered sensor data to integrator 74.

Integrator 74 may perform non-coherent integration (e.g., over the slow time dimension) on the filtered sensor data received from Fourier transform 70. This may produce a real-time range-azimuth power spectrum RAPSX (sometimes also referred to herein as real-time range and azimuth power spectrum data RAPSX). Integrator 74 may transmit real-time range-azimuth power spectrum RAPSX to CFAR 78 and to signal classifier 80 for subsequent processing. Integrator 74 may, for example, integrate forever without end or may include an averager that averages over a certain amount of chirps.

At the same time, Fourier transform 72 may apply one or more DFTs to baseline sensor data SDT0 to convert the baseline sensor data to range and azimuth coordinates. Integrator 76 may perform non-coherent integration (e.g., over the slow time dimension) on the converted baseline sensor data received from Fourier transform 72. This may produce a baseline range-azimuth power spectrum RAPS0 (sometimes also referred to herein as baseline range and power spectrum data RAPS0). Integrator 76 may transmit baseline range-azimuth power spectrum RAPS0 to signal classifier 80 for subsequent processing.

Diagram 83 of FIG. 5 shows one example of real-time range-azimuth power spectrum RAPSX output by integrator 74 (e.g., in range and azimuth coordinates). The horizontal axis of diagram 83 plots increasing azimuth angle. The vertical axis of diagram 83 plots increasing range angle. Each cell of diagram 83 represents a different spatial position relative to device 10 (e.g., a different combination or bin of range and azimuth values). Each cell of diagram 83 has a corresponding data/signal value or level (not shown in FIG. 5 for the sake of clarity) that corresponds to or represents the signal power or power density received by device 10 at the corresponding combination of range and azimuth. In general, range corresponds to radial distance from device 10 and azimuth corresponds to an angle within a plane orthogonal to the boresight direction of the antenna (s) 30 used by device 10 to transmit and/or receive signals 34 and 36. Since the stationary signal produced by signal reflection off stationary objects 42S are filtered out of the real-time sensor data by MTI filter 68, the power represented by each cell in diagram 83 corresponds only to the signal produced by the movement of a moving object 42 into and/or out of a position between device 10 and different combinations of range and azimuth with respect to device 10.

CFAR 78 may apply a constant false alarm rate algorithm to real-time range-azimuth power spectrum RAPSX in a manner that maintains an overall constant false alarm rate (e.g., where a false alarm is produced by the false detection of a given object). For a given test cell 79 (sometimes also referred to as cell under test (CUT) 79) at a corresponding test range R0 and test azimuth Y0, CFAR 78 may compare the value of test cell 79 to a combination of the values within a set of nearby reference cells 81 around test cell 79. CFAR 78 may output a detection signal (e.g., as detection data DETS) associated with test cell 79 when the value of test cell 79 exceeds the combination of values from the set of reference cells 81. The detection signal may be indicative of the detection of an object at the range and azimuth of the test cell (e.g., test range R0 and test azimuth Y0) while allowing for the detection to exhibit an overall constant false detection rate. The combination of values compared to the value of test cell 79 may, for example, be given by the sum of the values from the set of reference cells 81 multiplied by a constant factor that is selected to set the overall constant false alarm rate of detection signals output by CFAR 78. Implementations in which map generator 64 includes a CFAR detector such as CFAR 78 are illustrative and non-limiting. In general, CFAR 78 may be replaced with other false alarm rate detectors or other types of detectors.

To optimize the performance of CFAR 78 and thus the generated environment map RCM, the set of reference cells 81 may, for example, include at least two reference cells 81 at the same test range R0 as test cell 79 but at azimuth(s) greater than test azimuth Y0 and azimuth(s) less than test azimuth Y0. The set of reference cells 79 may also include at least one reference cell 81 at the same test azimuth Y0 as test cell 79 but at range(s) that are closer than test range R0 (e.g., cells at farther ranges may be omitted from the set of reference cells given that the signal from moving object 42M may raise the detection threshold and prevent the detection of the stationary object). If desired, the nearest cells to test cell 79 may be omitted from the set of reference cells 81.

CFAR 78 may perform the CFAR algorithm across each of the cells in real time range-azimuth power spectrum RAPSX to output corresponding detection data DETS (e.g., where each cell forms a test cell 79 that is compared to a corresponding set of reference cells 81). Detection data DETS may include or identify the cells in real time range-azimuth power spectrum RAPSX that produced a detection signal when compared to its corresponding set of reference cells 81. Each cell or data value of detection data DETS may, for example, identify the spatial position relative to device 10 where motion of moving object 42M produced reflected power that exceeds the combination of values from its corresponding set of reference cells 81. CFAR 78 may pass detection data DETS to signal classifier 80.

Signal classifier 80 may use baseline range-azimuth power spectrum RAPS0, real-time range-azimuth power spectrum RAPSX, and detection data DETS to identify, determine, detect, and/or classify which cells or data from detection data DETS are associated with the spatial position (e.g., range-azimuth combinations) of stationary object(s) 42S, which cells or data from detection data DETS are associated with the spatial position of moving object(s) 42M, and which cells or data from detection data DETS are associated with multipath detections of moving object(s) 42M. Signal classifier 80 may filter out or remove the cells or data from detection data DETS that are associated with the spatial position of moving object(s) 42M and the cells or data from detection data DETS that are associated with multipath detections of moving object(s) 42M, leaving only the cells or data from detection data DETS that are associated with the spatial position of stationary object(s) 42S.

Signal classifier 80 may output stationary object detection information BGDETS and may provide stationary object detection information BGDETS to detection accumulator 82. Stationary object detection information BGDETS may identify or include the cells or data of detection data DETS that are associated with the spatial position of stationary object(s) 42S. Stationary object detection information BGDETS may thereby include or identify the spatial position (e.g., range and azimuth) of each point on stationary object(s) 42S that was blocked by motion of moving object 42M when producing real-time sensing data SDTX. Stationary object detection information BGDETS may also identify the value (e.g., power level or density) of the cells or data of detection data DETS received at signal classifier 80.

This process may be repeated as moving object(s) 42M continue to move around environment 62 over time. Sensing circuitry 28 may continue to generate sets of real-time sensing data SDTX (e.g., frames, data cubes, etc.) as moving object(s) 42M move around environment 62 over time. Detection accumulator 82 may generate environment map RCM by accumulating the stationary object detection information BGDETS generated from each set of real-time sensing data SDTX. As moving object(s) 42M move between device 10 and each of the different possible points or locations on stationary objects 42S in environment 62 over time, detection accumulator 82 will generate an environment map RCM that accurately and precisely maps as many points on stationary objects 42S as possible, forming an environment map RCM that exhibits high spatial resolution. These stationary objects may form boundaries of environment 62 that are then detected by environment boundary estimator 66 (FIG. 4).

Figure 7:
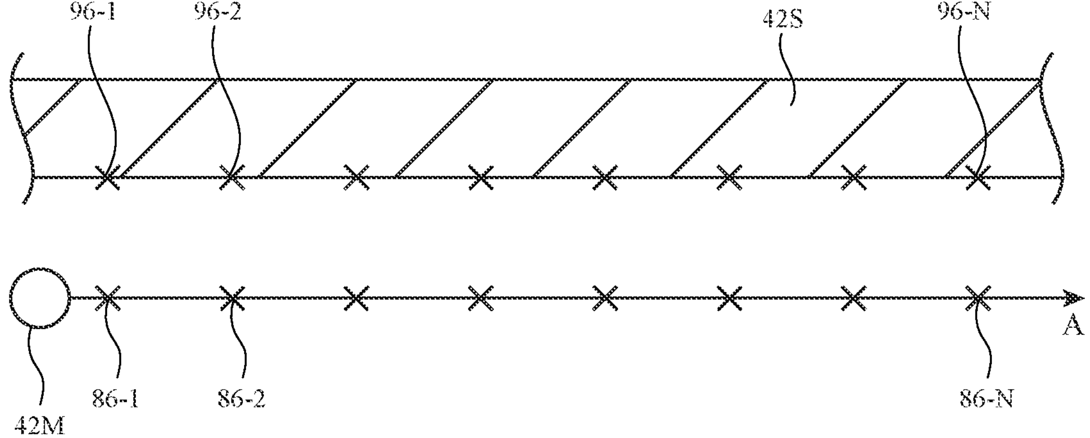
FIG. 7 is a diagram showing how illustrative wireless sensing circuitry may map points on a stationary object based on motion of a moving object between the stationary object and the wireless sensing circuitry in accordance with some embodiments.
Figure 7:
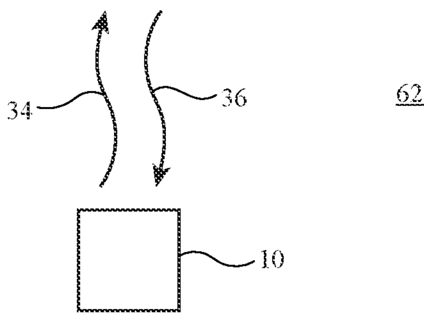

FIG. 7 is a diagram showing how device 10 may map different points on stationary objects 42S as moving object 42M moves between device 10 and stationary objects 42S. As shown in FIG. 7, moving object 42M may move through N positions 86 over time (e.g., from position 86-1 to position 86-2 and so on until position 86-N). Moving object 42M may block or occlude a different respective point or location 96 on stationary objects 42S at each of its N positions 86 (e.g., may block location 96-1 while at position 86-1, may block location 96-2 while at position 86-2, may block position 96-N while at position 86-N, etc.).

Device 10 may generate stationary object detection information BGDETS from the motion of moving object 42M into and/or away from each position 86, from position 86-1 to position 86-N (e.g., where map generator 64 receives N different sets of real-time sensor data SDTX, one corresponding to each position 86 of moving object 42M, and generates a different set of stationary object detection information BGDETS for each set of real-time sensor data SDTX). Each set of stationary object detection information BGDETS may, for example, identify the spatial position of at least the corresponding location 96 on stationary objects 42S. For example, the stationary object detection information BGDETS generated while moving object 42M moved into and/or away from position 86-1 may identify the range and azimuth from device 10 to location 96-1 on stationary object 42S, the stationary object detection information BGDETS generated while moving object 42M moved into and/or away from position 86-2 may identify the range and azimuth from device 10 to location 96-2 on stationary object 42S, the stationary object detection information BGDETS generated while moving object 42M moved into and/or away from position 86-N may identify the range and azimuth from device 10 to location 96-1 on stationary object 42S, etc.

By accumulating stationary object detection information BGDETS over time as one or more moving objects 42M moves around environment 62 between device 10 and different locations 96 on stationary objects 42S, device 10 may accumulate an environment map RCM that identifies as many locations 96 on stationary objects 42S as possible. Map generator 64 may, for example, generate an environment map RCM that identifies all stationary objects 42S around device 10 within environment 62 or within the field of view of device 10. Application of MTI filter 68 configures the object detections identified by the environment map RCM output by map generator 64 to only include data generated from moving object 42M changing/perturbing the stationary sensor data generated by reflection off points P on stationary objects 42S, rather than data generated by reflection off portions of the stationary objects 42S not perturbed by intervening moving objects.

In this way, map generator 64 may detect different locations 96 on stationary objects 42S over time based on perturbations or changes in the stationary sensor data caused by motion of moving object(s) 42M into and/or away from different points between those locations 96 and device 10 (e.g., perturbations or changes that pass the MTI filter), rather than by measuring reflections directly off of those locations 96 on stationary objects 42S. This may allow device 10 to implement as few as a single transmit antenna 30TX and/or a single receive antenna 30RX in mapping all of locations 96, thereby minimizing device resources, while allowing map generator 64 to generate environment map RCM with a spatial resolution that is as high or greater than would otherwise be achievable using a large array of antenna elements that measures reflections directly off of stationary objects 42S. In addition, map generator 64 may generate environment map RCM in less time and potentially with greater resolution and/or accuracy than in implementations where device 10 tracks the position of moving objects 42M over time and merely infers the presence of stationary objects 42S as locations where moving objects 42M do not travel (e.g., no-go zones) over a statistically significant amount of time.

Figure 8:
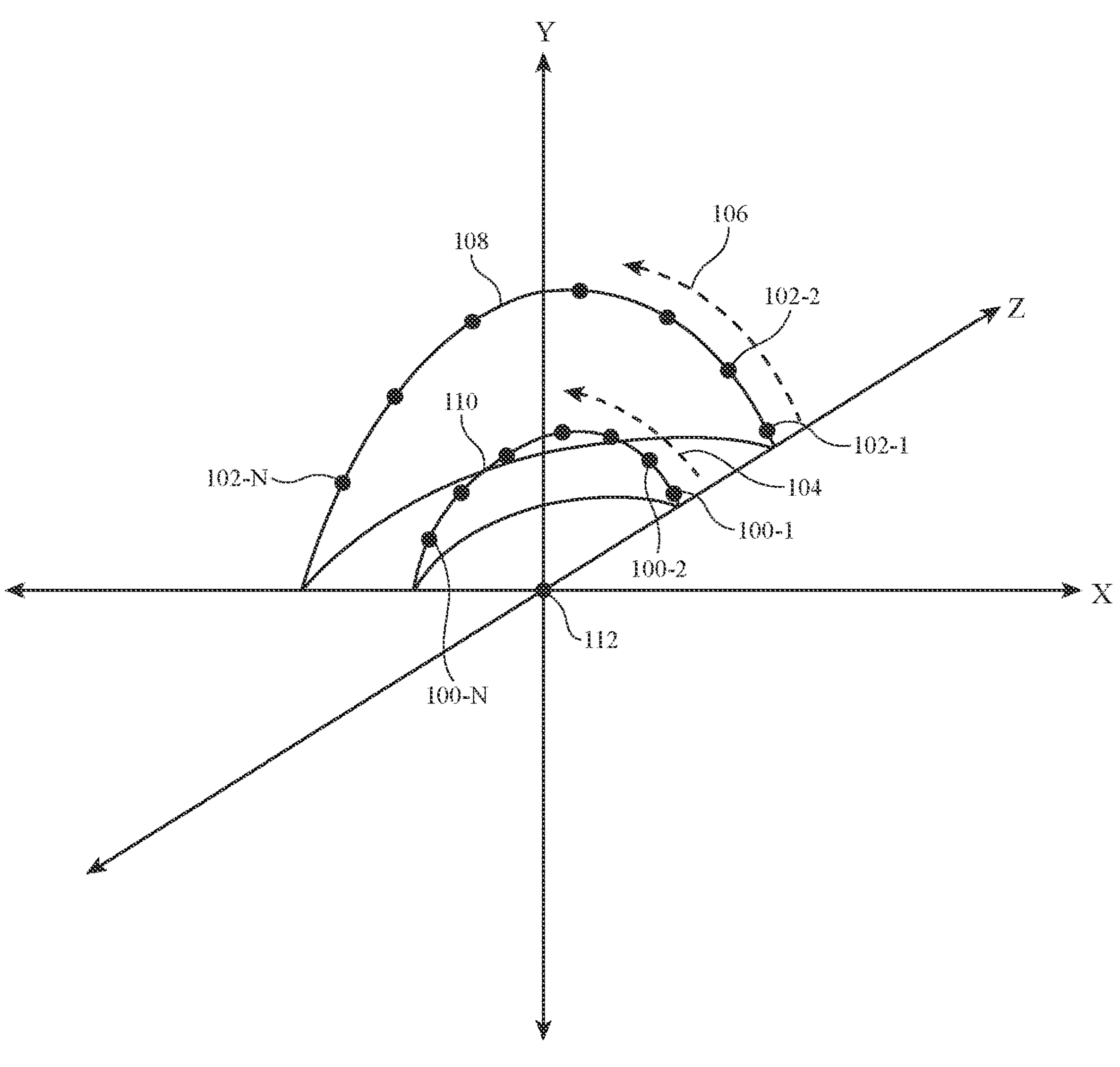
FIG. 8 is a three-dimensional plot of a spatial power spectrum that may be generated by an illustrative map generator while performing motion-based environment mapping in accordance with some embodiments.

FIG. 8 is a three-dimensional plot of a spatial power spectrum that may be generated by map generator 64 while performing motion-based environment mapping. The axes of FIG. 8 are three-dimensional Cartesian axes for the sake of illustration. Device 10 is located at the origin (point 112). In the example of FIG. 8, device 10 has a field of view facing the +Z, +Y, and −X directions. This is illustrative and, in general, any desired coordinate systems may be used to illustrate the spatial power spectrum and device 10 may have any desired field of view.

The spatial power spectrum of FIG. 8 is taken after MTI filtering at map generator 64 and therefore only includes signal contributions produced by the motion of a moving object 42M in front of stationary objects 42S. Signal reflections off stationary objects 42S without an intervening moving object 42M are filtered out by MTI filter 68. The spatial power spectrum of FIG. 8 may, for example, represent detection signal DETS (FIG. 5) prior to classification by signal classifier 80. Points 100 and 102 of FIG. 8 correspond to spatial locations from which the local signal received at device 10 (e.g., in real-time sensor data SDTX) has a power exceeding a threshold level.

The real-time sensor data SDTX corresponding to a moving object 42M moving into and/or away from position 86-1 (FIG. 7) may cause the power spectrum to include a first point 100-1. The spatial coordinates of point 100-1 may correspond to the spatial coordinates of position 86-1 (e.g., from signal reflection off moving object 42M). At the same time, the real-time sensor data SDTX corresponding to the moving object moving into and/or away from position 86-1 may cause the power spectrum to include a second point 102-1 behind point 100-1 from the perspective of device 10. The peak in power spectrum associated with point 102-1 is produced by a stationary object 42S behind moving object 42M while moving object 42M moves to block and then to unblock the stationary object over time. The spatial coordinates of point 102-1 may correspond to the spatial coordinates of position 96-1 of FIG. 7.

Similarly, real-time sensor data SDTX corresponding to moving object 42M moving into and/or away from position 86-2 (FIG. 7) may cause the power spectrum to include a second point 100-2. The spatial coordinates of point 100-2 may correspond to the spatial coordinates of position 86-2 (e.g., from signal reflection off moving object 42M). At the same time, the real-time sensor data SDTX corresponding to the moving object 42M moving into and/or away from position 86-2 may cause the power spectrum to include a second point 102-2 behind point 100-2 from the perspective of device 10. The peak in power spectrum associated with point 102-2 is produced by a stationary object 42S behind moving object 42M as moving object 42M moves in front of the stationary object over time. The spatial coordinates of point 102-2 may correspond to the spatial coordinates of locations 96-2 of FIG. 7.

This process may continue as moving object 42M moves through different positions 86 and thus in front of different locations 96 on stationary object 42 over time (e.g., along arrow A in FIG. 7). As moving object 42M moves over time, different points 100 are produced in the spatial power spectrum along a first sphere 110 (e.g., in the direction of arrow 104) due to signal reflection off moving object 42M. At the same time, different points 102 are produced in the spatial power spectrum along a second sphere 108 having a greater radius than sphere 110 due to the motion of moving object 42M into and/or away from positions blocking different locations 96 along stationary objects 42S (e.g., due to perturbations or changes in the stationary sensor data produced by moving object 42M). In other words, each point 100 may correspond to one of the N positions 86 of FIG. 7 and each point 102 may correspond to one of the N locations 96 of FIG. 7.

Signal classifier 80 (FIG. 5) may compare the power spectrum of FIG. 8 to baseline range-azimuth power spectrum RAPS0 and/or real-time range-azimuth power spectrum RAPSX to identify that points 100 are associated with reflection off of moving object 42M rather than the spatial location of stationary objects 42S. Signal classifier 80 may then remove or filter out points 100 associated with direct reflection off moving object 42M, leaving only points 102 associated with the spatial position of stationary objects 42S (e.g., stationary object detection information BGDETS of FIG. 5 may include points 102 but not points 100).

Detection accumulator 82 may continue to accumulate points 102 in this way over time to generate environment map RCM (e.g., environment map RCM may include one or more sets of points 102 as shown in FIG. 8 for different locations of stationary objects 42S in environment 62 as moving objects 42M continue to move around device 10). The overall number of accumulated points 102 and the spacing between adjacent accumulated points 102 correspond to the spatial resolution of environment map RCM. By leveraging the motion of moving objects 42M to occlude different locations 96 on stationary objects 42S, map generator 64 may maximize the number of points 102 accumulated in environment map RCM (e.g., minimizing the spacing between adjacent points 102) and thus the spatial resolution of environment map RCM using as few as only a single transmit antenna 30TX and/or a single receive antenna 30RX, thereby minimizing resource consumption, space consumption, and cost at device 10.

Figure 9:
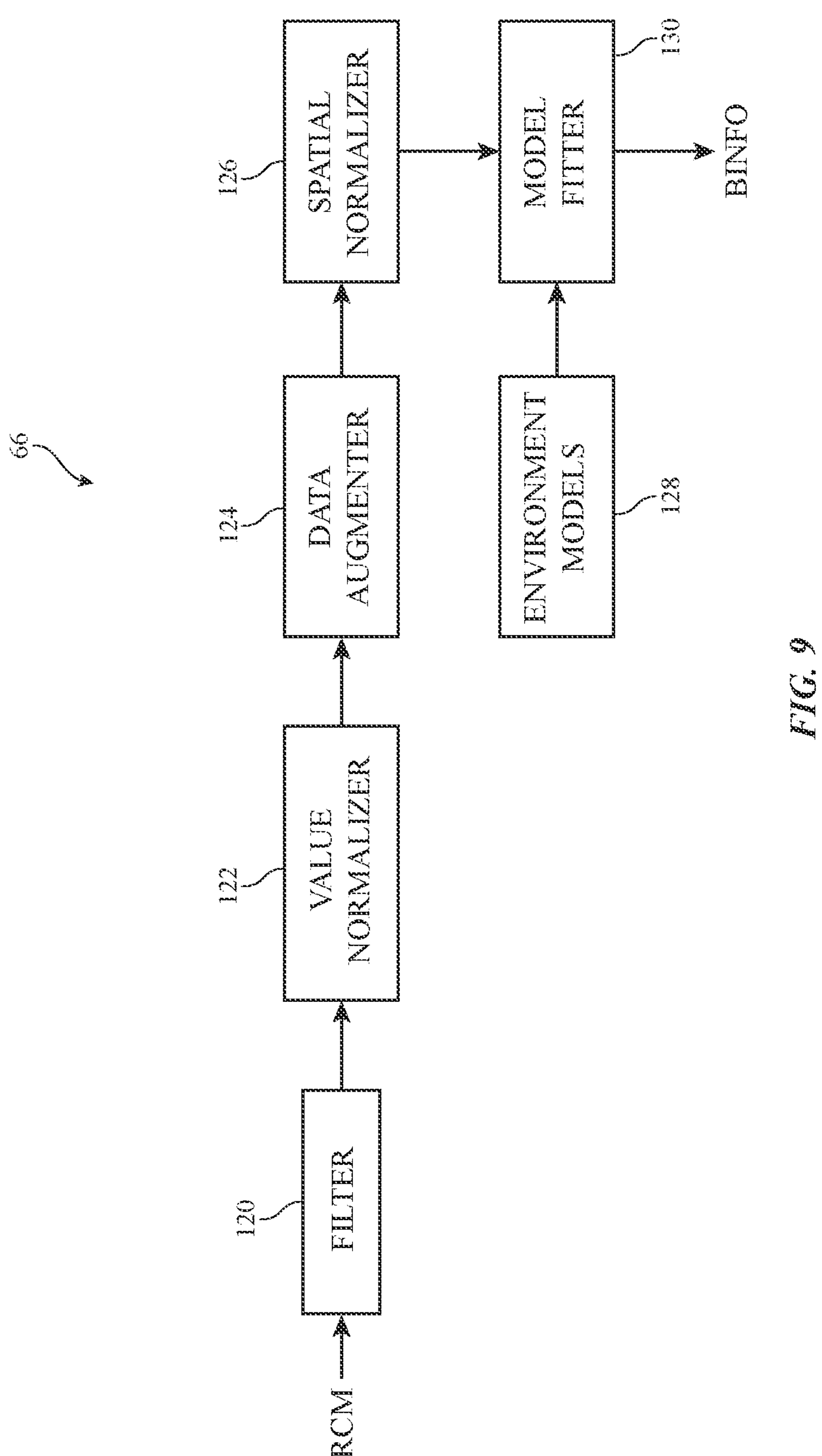
FIG. 9 is a schematic circuit diagram of an illustrative environment boundary estimator that performs motion-based environment mapping in accordance with some embodiments.

FIG. 9 is a schematic circuit diagram of environment boundary estimator 66. As shown in FIG. 9, environment boundary estimator 66 may include filter circuitry such as filter 120, value normalizer circuitry such as value normalizer 122, data augmenter circuitry such as data augmenter 124, spatial normalizer circuitry such as spatial normalizer 126, model fitting circuitry such as model fitter 130, and one or more environment models 128. Environment models 128 may be stored on storage circuitry in device 10, for example.

The output of filter 120 may be coupled to the input of value normalizer 122. The output of value normalizer 122 may be coupled to the input of data augmenter 124. The output of data augmenter 124 may be coupled to the input of spatial normalizer 126. The output of spatial normalizer 126 may be coupled to a first input of model fitter 130. Model fitter 130 may have a second input that receives one or more of environment models 128.

Filter 120 may receive environment map RCM from map generator 64. Environment map RCM may include a set of accumulated points 102 (FIG. 8) having corresponding spatial coordinates and power values. If desired, filter 120 may filter out contributions to environment map RCM (e.g., points 102) from relatively small reflectors in stationary objects 42S such as furniture. Environment map RCM is sometimes described and/or shown herein in two dimensions but, in general, environment map RCM may be a three-dimensional map or a one-dimensional map.

Value normalizer 122 may adjust the number of detections (e.g., points 102) in environment map RCM to mitigate bias due to particular situations such as target trajectory, radar orientation, etc. Data augmenter 124 may, if desired, use environment map RCM to sample other detections based on waveform properties (e.g., angular resolution, etc.). Spatial normalizer 126 may modify the format or coordinates of the data in environment map RCM (e.g., by normalizing the spatial coordinates to values between 0 and 1, thereby optimizing the subsequent model fitting procedure by model 130).

Model fitter 130 may compare different environment models 128 to environment map RCM to identify a best-fitting environment model 128 for the remaining points in the environment map (e.g., using any desired performance or optimization function that outputs the best parameterized environment model). Model fitter 130 may output environment boundary information BINFO based on environment map RCM and environment models 128. Environment boundary information BINFO may, for example, identify the environment model 128 that best fits the points in environment map RCM. The best-fitting environment model 128 may include a model of the edges or boundaries of environment 62 (e.g., one or more walls, the floor, the ceiling, etc.). Environment boundary information BINFO may identify the best-fitting environment model 128 using any desired data or parameters (e.g., equations defining the surfaces and/or lines that define the edges or boundaries of environment 62 as formed by the detected stationary objects 42S). Model fitter 130 may output environment boundary information BINFO for subsequent processing by control circuitry 14 (FIG. 1).

Figure 10:
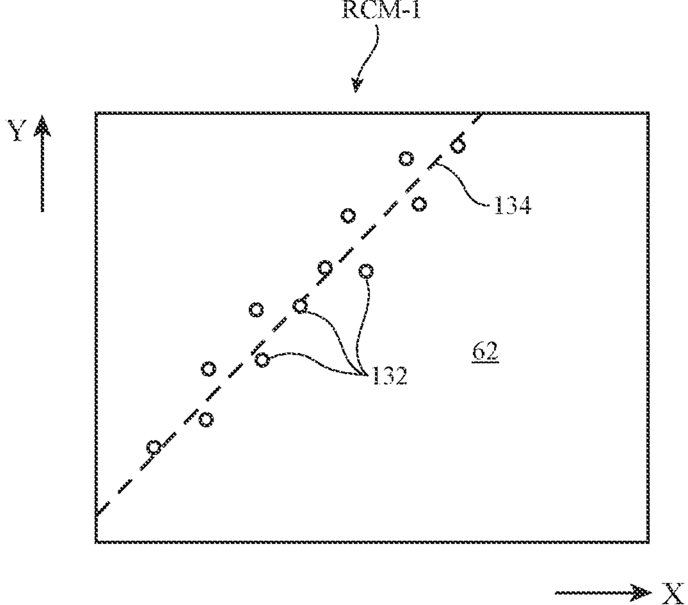
FIG. 10 is a diagram showing how an illustrative environment boundary estimator may identify environment boundaries based on an environment map output by a map generator in accordance with some embodiments.
Figure 10:
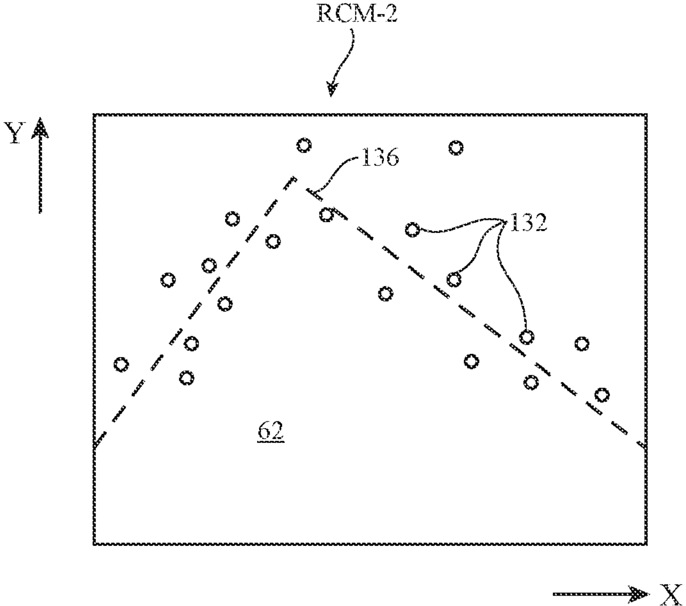

FIG. 10 is a diagram showing how model fitter 130 may identify different best-fitting environment models 128 for different environment maps RCM. FIG. 10 plots a two-dimensional example of a first environment map RCM-1 and a second environment map RCM-2 that may be generated by map generator 64 (e.g., for different environments 62). This is illustrative and, if desired, environment maps RCM may be three-dimensional and/or may use any desired coordinate system.

As shown in FIG. 10, the points 132 of environment map RCM-1 each correspond to a respective point 102 (FIG. 7) that passed filter 120, value normalizer 122, data augmenter 124, and spatial normalizer 126 of FIG. 9. Each point 132 has a different respective spatial location. Model fitter 130 may attempt to fit a set of different environment models 128 to the points 132 of environment map RCM-1. Model fitter 130 may, for example, identify a best-fitting environment model 134 that best fits the points 132 of environment map RCM-1. In this example, the points 132 of environment map RCM-1 may be produced by a stationary object 42S such as a straight wall. The best-fitting environment model 134 may be a line or plane that estimates or approximates the edge or boundary of environment 62 (e.g., the straight wall) and that passes through points 132 (e.g., while minimizing a cost function or any other desired fitting function associated with fitting points 132 with different mathematical models for an edge or boundary of environment 62).

Turning to environment map RCM-1, the points 132 of environment map RCM-1 each correspond to a respective point 102 (FIG. 7) that passed filter 120, value normalizer 122, data augmenter 124, and spatial normalizer 126 of FIG. 9. Each point 132 has a different respective spatial location. Model fitter 130 may attempt to fit a set of different environment models 128 to the points 132 of environment map RCM-2. Model fitter 130 may, for example, identify a best-fitting environment model 136 that best fits the points 132 of environment map RCM-2. In this example, the points 132 of environment map RCM-1 may be produced by stationary objects 42S such as two straight walls that intersect at the corner of environment 62 (e.g., a cornered wall). The best-fitting environment model 136 may be intersecting lines or planes that estimate or approximate the edge or boundary of environment 62 and that pass through points 132 (e.g., while minimizing a cost function or any other desired fitting function associated with fitting points 132 with different mathematical models for an edge or boundary of environment 62). Best-fitting environment models 134 and 136 are sometimes also referred to herein as environment boundary models or simply as boundary models.

As shown by environment maps RCM-1 and RCM-2 of FIG. 10, environment model 136 may be the best fitting model for environment map RCM-2 but is not a satisfactory fit for the points 132 in environment map RCM-1. Similarly, environment model 134 may be the best fitting model for environment map RCM-1 but is not a satisfactory fit for the points 132 in environment map RCM-2. Model fitter 130 may iterate over or test different environment models 128 until the best fitting environment model for a given environment map RCM is found. Model fitter 130 may identify or include the best-fitting model and thus the boundary or boundaries of environment 62 in output environment boundary information BINFO. In this way, sensing circuitry 28 may identify the boundaries of environment 62 with high resolution and using a minimal number of antennas 30.

Figure 11:
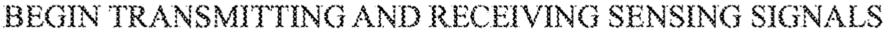
FIG. 11 is a flow chart of illustrative operations involved in using wireless sensing circuitry to perform motion-based environment mapping in accordance with some embodiments.

FIG. 11 is a flow chart of operations that may be processed by sensing circuitry 28 (FIG. 2) to perform motion-based environment mapping (e.g., to map environment 62 and its boundaries/edges as defined by stationary objects 42S based on one or more moving objects 42M). At operation 140, sensing circuitry 28 may begin transmitting sensing signals 34 and receiving corresponding reflected signals 36. ADC 58 in sensing receiver 56 may generate sets of sensing data SDT based on reflected signals 36 as the reflected signals are received over time. Sensing circuitry 28 may continue to transmit sensing signals 34 and receive reflected signals 36 while processing the remaining operations of FIG. 11.

At operation 142, map generator 64 may generate (e.g., produce, output, calculate, compute, compile, accumulate, identify, detect, etc.) environment map RCM based on the transmitted sensing signals 34, the received reflected signals 36 (e.g., sensing data SDT), and the motion of one or more moving objects 42M through different positions 86 (FIG. 9) between device 10 and different locations 96 on stationary objects 42S (e.g., perturbations in stationary sensing data in sensing data SDT as caused by moving objects 42M). Map generator 64 may accumulate the data or values in environment map RCM (e.g., points 102 of FIG. 8) as the moving objects 42M move around environment 62 over time to temporarily occlude or block different locations 96 on stationary objects 42S from the perspective of device 10 (e.g., as a series of sets of sensing data SDT is received). Leveraging the motion of moving objects 42M into and out of occlusion between stationary objects 42S and device 10 may allow environment map RCM to be generated with relatively high resolution using as few antennas 30 in device 10 as possible.

At operation 144, environment boundary estimator 66 may generate (e.g., produce, output, calculate, compute, compile, accumulate, identify, detect, etc.) environment boundary information BINFO based on environment map RCM and one or more parametrizable environment models 128 (sometimes also referred to herein as environment boundary models 128 or simply as boundary models 128). Environment boundary information BINFO may, for example, identify or include the best-fitting environment model 128 for the points in environment map RCM (e.g., model 134 for environment map RCM-1 of FIG. 10, model 136 for environment map RCM-2 of FIG. 10, etc.).

At operation 146, control circuitry 14 may perform any desired actions or operations based on environment boundary information BINFO (e.g., based on the boundaries of environment 62 as detected or identified by environment boundary estimator 66). As one example, device 10 may use the identified boundaries to identify when radio-frequency signals 63 (FIG. 3) are incident upon device 10 from a source or location located outside of the identified boundaries of environment 62 and may filter out or mask the radio-frequency signals from being received, decoded, demodulated, and/or provided to the user of device 10. This may, for example, help to preserve the privacy of the other users who may be operating the device(s) that produced radio-frequency signals 63.

As another example, device 10 (e.g., one or more input-output devices 22 of FIG. 1) may generate, produce, emit, alter, adjust, and/or modify a device output 61 (FIG. 3) based on the identified boundaries of environment 62. Device output 61 may include a visual output, a haptic output, a wireless, and/or an audio output. The visual output may include light emitted by one or more light sources on device 10 and/or image or video data displayed by one or more displays on device 10 (e.g., the visual output may include generation and/or adjustment of one or more virtual objects displayed by a virtual and/or augmented reality display on device 10). As another example, the audio, haptic, and/or wireless output may include navigation instructions, warnings, alerts, directions, and/or other output based on the detected boundaries of environment 62. These outputs may, for example, help to describe to the user of device 10 where the boundaries of environment 62 are located and/or may alert the user when the user approaches or is near to one of the detected boundaries (e.g., using an accessibility or vision impairment assistance application). These outputs may, for example, allow a vision-impaired user of device 10 to freely move through environment 62 without hitting the detected boundaries and without requiring the user to view the detected boundaries (e.g., stationary objects 42S). These examples are illustrative and non-limiting and, in general, device 10 may perform any desired operations and/or may produce any desired output based on the boundaries detected based on environment map RCM as generated while performing room mapping.

Figure 12:
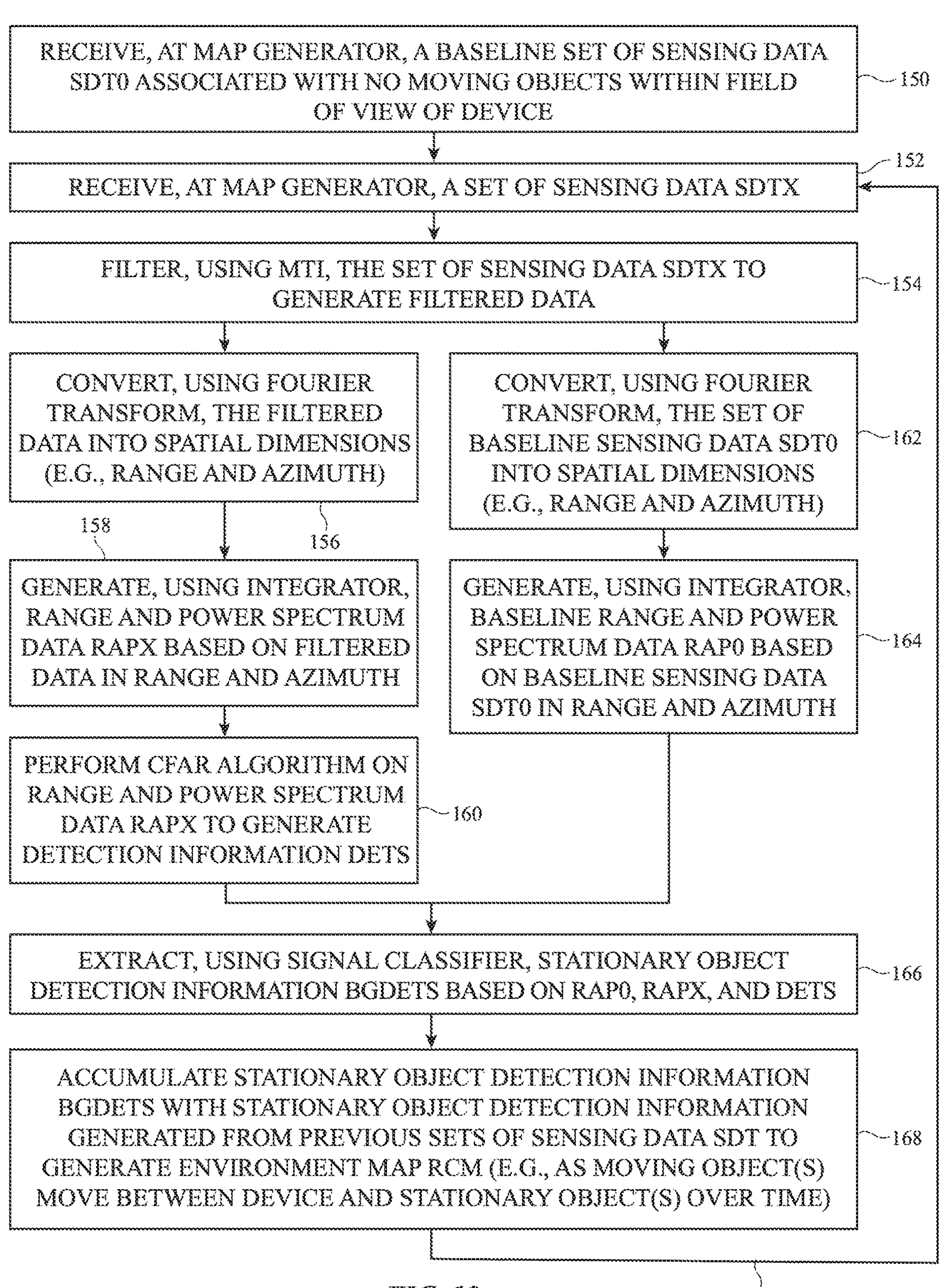
FIG. 12 is a flow chart of illustrative operations involved in using a map generator to output an environment map while performing motion-based environment mapping in accordance with some embodiments.

FIG. 12 is a flow chart of operations that may be performed by map generator 64 (FIG. 5) to generate environment map RCM. At operation 150, map generator 64 may receive baseline sensing data SDT0 associated with the absence of moving objects within the field of view of device 10. Map generator 64 may store baseline sensing data SDT0 for subsequent processing.

At operation 152, map generator 64 may receive a set of real-time sensing data SDTX from ADC 58 (FIG. 2). Real-time sensing data SDTX may include stationary sensor data produced from reflected signals 36 received by device 10 after reflection off different points on stationary objects 42S.

At operation 154, MTI filter 68 may generate filtered data by applying an MTI filter to the set of real-time sensing data SDTX. This may filter out stationary sensor data produced from signal reflection off points on stationary objects 42S that are not blocked by moving objects 42M (e.g., portions of the stationary sensor data that are not changed or perturbed by moving objects 42M), leaving (as filtered data) stationary sensor data having changes or perturbations over time caused by motion of moving object(s) 42M through positions 86 that occlude corresponding points on stationary object(s) 42S from device 10.

Operations 156-160 may be performed concurrently with operations 162 and/or 164. Alternatively, operations 162 and 164 may be performed prior to operation 156. At operation 162, Fourier transform 72 may convert the set of baseline sensing data SDT0 into spatial dimensions (e.g., range and azimuth).

At operation 164, integrator 76 may generate baseline range-power spectrum RAPS0 based on the set of baseline sensing data SDT0 in spatial dimensions (e.g., range and azimuth). Integrator 76 may pass baseline range-power spectrum RAPS0 to signal classifier 80.

At operation 156, Fourier transform 70 may convert the filtered data output by MTI filter 68 into spatial dimensions (e.g., range and azimuth).

At operation 158, integrator 74 may generate real-time range-power spectrum RAPSX based on the filtered data in spatial dimensions (e.g., range and azimuth). Integrator 74 may pass real-time range-power spectrum RAPSX to signal classifier 80 and CFAR 78.

At operation 160, CFAR 78 may perform a CFAR algorithm on real-time range-power spectrum RAPSX (e.g., as shown by diagram 83 of FIG. 5) to generate detection information DETS (e.g., as illustrated by points 102 and 100 of FIG. 8).

At operation 166, signal classifier 80 may extract (e.g., generate, identify, compute, calculate, produce, output, etc.) stationary object detection information BGDETS (e.g., as illustrated by points 102 but not points 100 of FIG. 8) from detection information DETS based on real-time range-power spectrum RAPSX and baseline range-power spectrum RAPS0 (e.g., filtering out detections associated with reflection off moving objects 42M and/or multipath detections).

At operation 168, detection accumulator 82 may accumulate the stationary object detection information BGDETS generated by map generator 64 from previous sets of real-time sensing data SDTX to generate environment map RCM. Processing may loop back to operation 152 via path 170 as additional sets of real-time sensing data SDTX are received (e.g., as moving objects 42M move around environment 62 to block different points on stationary objects 42S from the perspective of device 10). Map generator 64 may iterate over operations 152-168 a predetermined number of times, for a predetermined time period, until the accumulated environment map RCM exhibits at least a threshold resolution, or until detection of any desired trigger condition.

Figure 13:
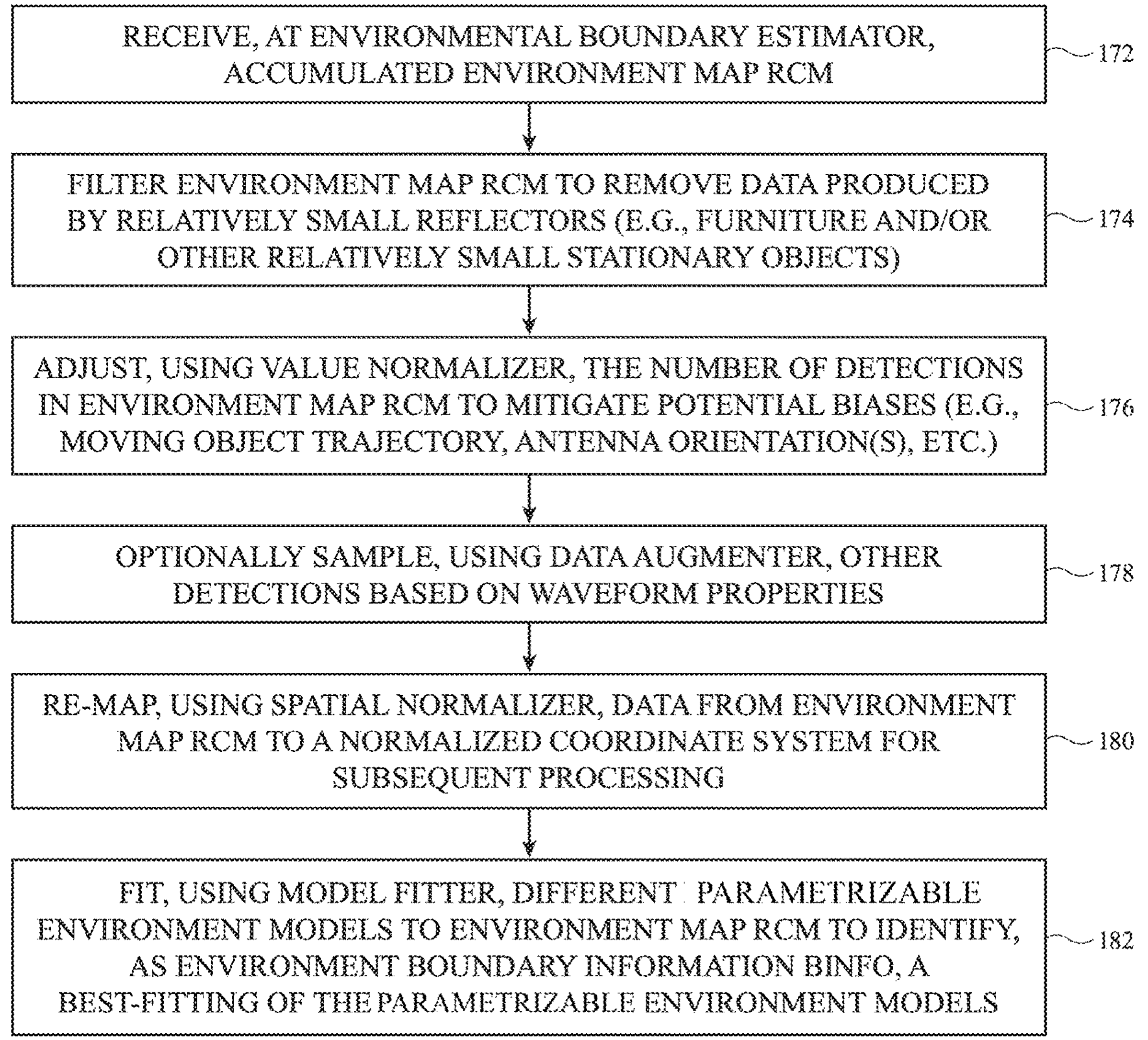
FIG. 13 is a flow chart of illustrative operations involved in using an environment boundary estimator to identify environmental boundaries based on an environment map output by a map generator in accordance with some embodiments.

FIG. 13 is a flow chart of operations that may be performed by environment boundary estimator 66 (FIG. 9) to generate boundary information BINFO based on environment map RCM and environment models 128. At operation 172, filter 120 may receive environment map RCM from map generator 64.

At operation 174, filter 120 may filter environment map RCM (e.g., to remove detections or points 102 of FIG. 8 that were produced by relatively small reflectors in stationary objects 42S such as furniture). Operation 174 may be omitted if desired.

At operation 176, value normalizer 122 may adjust the number of detections in environment map RCM (e.g., points 102 of FIG. 8) to mitigate potential biases (e.g., to compensate for the trajectory of moving object 42M, antenna orientation on device 10, etc.). Operation 176 may be omitted if desired.

At operation 178, data augmenter 124 may sample other detections in environment map RCM (e.g., angular resolution) based on various waveform properties. Operation 178 may be omitted if desired.

At operation 180, spatial normalizer 126 may re-map the data in environment map RCM (e.g., points 102 of FIG. 8) to a normalized coordinate system for subsequent processing (e.g., a coordinate system having values between 0 and 1). Operation 180 may be omitted if desired.

At operation 182, model fitter 130 may fit a set of one or more parametrizable environment models 128 to the remaining points 132 in environment map RCM (FIG. 10). Model fitter 130 may identify (e.g., calculate, compute, generate, output, produce, estimate, detect, etc.) a best-fitting of environment models 128 for the points 132 in environment map RCM. Model fitter 130 may include or identify the best-fitting environment model 128 in boundary information BINFO (e.g., as a best fitting boundary model for environment map RCM). Models 128 may be static or may be adjustable (e.g., parametrizable).

The examples of FIGS. 5-13 are illustrative and non-limiting. If desired, MTI filter 68 may be coupled between Fourier transform 70 and integrator 74 (FIG. 5). MTI filter 68 may effectively perform high pass filtering on the signal received by map generator 64. Alternatively, MTI filter 68 may be omitted from map generator 64. In these implementations, Fourier transform 70 may itself perform high pass filtering on the signal received by map generator 64. As a first example, Fourier transform 70 may ignore or filter out zero-Doppler bins of the signal, causing Fourier transform 70 to output a Fourier transformed (e.g., spatial domain) signal without or free from zero-Doppler bins. In this example, subsequent processing is performed by the rest of map generator 64 only on non-zero-Doppler bins of the signal received by map generator 64. As a second example, map generator 64 may include a subtractor (e.g., subtraction circuitry or logic) coupled to input of Fourier transform 70. In this example, the subtractor may subtract, from the signal received by map generator 64, an average of the chirps (e.g., over slow time) in the signal received by map generator 64. This may produce a difference signal that is output by the subtractor and input to Fourier transform 70. The operations of FIG. 12 may be adapted to accommodate these examples in which MTI filter 68 is omitted from map generator 64 (e.g., where operation 154 is omitted and zero-Doppler bins are discarded at operations 156 and/or 162, where operation 154 is replaced with the subtraction of the average of sensing data SDTX over slow time from sensing data SDTX, etc.).

As used herein, the term "concurrent" means at least partially overlapping in time. In other words, first and second events are referred to herein as being "concurrent" with each other if at least some of the first event occurs at the same time as at least some of the second event (e.g., if at least some of the first event occurs during, while, or when at least some of the second event occurs). First and second events can be concurrent if the first and second events are simultaneous (e.g., if the entire duration of the first event overlaps the entire duration of the second event in time) but can also be concurrent if the first and second events are non-simultaneous (e.g., if the first event starts before or after the start of the second event, if the first event ends before or after the end of the second event, or if the first and second events are partially non-overlapping in time). As used herein, the term "while" is synonymous with "concurrent."

As described above, one aspect of the present technology is the gathering and use of information such as biometric information or sensor information. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, eyeglasses prescription, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data.

If desired, an apparatus may be provided that includes means to perform one or more elements or any combination of elements of one or more methods or processes described herein.

If desired, one or more non-transitory computer-readable media may be provided that include instructions to cause an electronic device, upon execution of the instructions by one or more processors of the electronic device, to perform one or more elements or any combination of elements of one or more methods or processes described herein.

If desired, an apparatus may be provided that includes logic, modules, or circuitry to perform one or more elements or any combination of elements of one or more methods or processes described herein.

If desired, an apparatus may be provided that includes one or more processors and one or more non-transitory computer-readable storage media comprising instructions that, when executed by the one or more processors, cause the one or more processors to perform one or more elements or any combination of elements of one or more methods or processes described herein.

If desired, a signal (e.g., a signal encoded with data), datagram, information element (IE), packet, frame, segment, PDU, or message may be provided that includes or performs one or more elements or any combination of elements of one or more methods or processes described herein.

If desired, an electromagnetic signal may be provided that carries computer-readable instructions, where execution of the computer-readable instructions by one or more processors causes the one or more processors to perform one or more elements or any combination of elements of one or more methods or processes described herein.

If desired, a computer program may be provided that includes instructions, where execution of the program by a processing element causes the processing element to carry out one or more elements or any combination of elements of one or more methods or processes described herein.

The foregoing is merely illustrative and various modifications can be made to the described embodiments. The foregoing embodiments may be implemented individually or in any combination.

What is claimed is:

1. A method of operating an electronic device comprising:

transmitting, via one or more antennas, radio-frequency signals into an environment that contains a moving object and a stationary object;

receiving, via the one or more antennas, reflected radio-frequency signals from the environment; and estimating, using one or more processors, a boundary of the environment based on a motion, as identified from the reflected radio-frequency signals, of the moving object into a position between the electronic device and the stationary object, wherein the boundary includes a point on the stationary object that is blocked by the moving object while the moving object is at the position.

2. The method of claim 1, further comprising:

generating, using an analog-to-digital converter (ADC), sensor data based on the reflected radio-frequency signals received via the one or more antennas, wherein estimating the boundary comprises estimating the boundary based on the sensor data.

3. The method of claim 2, further comprising:

generating, using the one or more processors, filtered data by applying a moving target indicator (MTI) filter to the sensor data, wherein estimating the boundary comprises estimating the boundary based on the filtered data.

4. The method of claim 3, further comprising:

generating, using the one or more processors, a range-azimuth power spectrum by integrating the filtered data over a slow time axis of the sensor data, wherein estimating the boundary comprises estimating the boundary based on the range-azimuth power spectrum.

5. The method of claim 4, further comprising:

generating, using the one or more processors, a detection signal by applying a constant false alarm rate (CFAR) algorithm to the range-azimuth power spectrum; and accumulating, using the one or more processors, a map of different spatial locations in the environment based on the detection signal, wherein estimating the boundary comprises estimating the boundary based on the map.

6. The method of claim 5, wherein estimating the boundary comprises fitting the map to different environment boundary models and outputting, as the estimated boundary, a best-fitting of the different environment boundary models.

7. The method of claim 1, further comprising:

displaying, using a display, an image based on the estimated boundary.

8. The method of claim 1, further comprising:

outputting, using a speaker, audio based on the estimated boundary.

9. An electronic device comprising:

one or more transceivers configured to transmit radio-frequency signals into an environment and configured to receive reflected signals from one or more stationary objects in the environment; and one or more processors configured to accumulate a map of the one or more stationary objects in the environment based on changes in the reflected signals produced by movement of one or more moving objects through different positions between the electronic device and the one or more stationary objects over time, and estimate a boundary of the environment based on the accumulated map of stationary objects, wherein the boundary includes points on the one or more stationary objects that are blocked by the one or more moving objects while the one or more moving objects are at the different positions.

10. The electronic device of claim 9, further comprising:

an analog-to-digital converter configured to generate sensing data based on the reflected signals, the one or more processors being further configured to generate filtered data by applying a moving target indicator (MTI) filter to the sensing data, and accumulate the map of stationary objects based on the filtered data, wherein the map of stationary objects identifies portions of the filtered data at different spatial locations in the environment.

11. The electronic device of claim 9, further comprising:

an analog-to-digital converter configured to generate sensing data based on the reflected signals, the one or more processors being further configured to apply a Fourier transform to the sensing data to generate a spatial domain signal, discard zero-Doppler bins from the spatial domain signal, and accumulate the map of stationary objects based on non-zero-Doppler bins of the spatial domain signal.

12. The electronic device of claim 9, further comprising:

an analog-to-digital converter configured to generate sensing data based on the reflected signals, the one or more processors being further configured to subtract, from the sensing data, an average of the sensing data over a slow time axis to generate a difference signal, apply a Fourier transform to the difference signal to generate a spatial domain signal, and accumulate the map of stationary objects based on the spatial domain signal.

13. A method of operating an electronic device comprising:

transmitting, via one or more antennas, sensing signals into an environment that contains a moving object and a stationary object;

receiving, via the one or more antennas, reflected signals corresponding to the sensing signals, the reflected signals having reflected off the stationary object;

generating, using an analog-to-digital converter (ADC), sensing data based on the reflected signals;

generating, using one or more processors, filtered data by applying a moving target indicator (MTI) filter to the sensing signals, wherein the filtered data is indicative of a movement of the moving object through a position between the electronic device and the stationary object; and detecting, using the one or more processors, a location on the stationary object based on the filtered data.

14. The method of claim 13, wherein the moving object occludes the location on the stationary object from the electronic device while the moving object is at the position.

15. The method of claim 13, further comprising:

generating, using the one or more processors, a spatial power spectrum based on the filtered data, wherein detecting the location comprises detecting the location based on the spatial power spectrum.

16. The method of claim 15, further comprising:

filtering, using the one or more processors, a signal contribution from the spatial power spectrum that was produced by reflection of the sensing signals off the moving object.

17. The method of claim 15, wherein detecting the location comprises comparing the spatial power spectrum to an additional spatial power spectrum that is generated by the one or more processors while moving objects are absent from the environment.

18. The method of claim 13, wherein the filtered data is indicative of an additional movement of the moving object through an additional position between the electronic device and the stationary object, the method further comprising:

detecting, using the one or more processors, an additional location on the stationary object based on the additional movement of the moving object through the additional position between the electronic device and the stationary object; and generating, using the one or more processors, a spatial map of the environment that identifies the location and the additional location.

19. The method of claim 18, further comprising:

identifying, using the one or more processors, a boundary of the environment based on the location and the additional location.

* * * * *